(12) United States Patent
Kim et al.

(10) Patent No.: US 10,600,368 B2
(45) Date of Patent: Mar. 24, 2020

(54) ORGANIC LIGHT-EMITTING DISPLAY DEVICE

(71) Applicant: Samsung Display Co., Ltd., Yongin-si, Gyeonggi-do (KR)

(72) Inventors: Tae Jin Kim, Bucheon-si (KR); Ja Kyoung Jin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/133,447

(22) Filed: Sep. 17, 2018

(65) Prior Publication Data

US 2019/0108793 A1 Apr. 11, 2019

(30) Foreign Application Priority Data

Oct. 11, 2017 (KR) .......................... 10-2017-0129748

(51) Int. Cl.
*G09G 3/30* (2006.01)
*G09G 3/3266* (2016.01)
(Continued)

(52) U.S. Cl.
CPC ......... *G09G 3/3266* (2013.01); *G09G 3/3233* (2013.01); *H01L 27/3276* (2013.01); *H01L 51/5237* (2013.01); *G09G 3/3258* (2013.01); *G09G 2300/0426* (2013.01); *G09G 2300/0819* (2013.01); *G09G 2300/0842* (2013.01); *G09G 2310/0232* (2013.01); *G09G 2310/0262* (2013.01); *G09G 2310/0264* (2013.01); *G09G 2320/0686* (2013.01); *H01L 51/5253* (2013.01)

(58) Field of Classification Search
CPC ...... G09G 2380/02; G06F 2203/04102; G06F 1/1652
See application file for complete search history.

(56) References Cited

U.S. PATENT DOCUMENTS

| 8,723,824 B2 | 5/2014 | Myers et al. |
| 9,287,329 B1 * | 3/2016 | Lee ..................... H01L 51/0097 |

(Continued)

FOREIGN PATENT DOCUMENTS

| JP | 2009-69768 A | 4/2009 |
| KR | 10-0599470 | 7/2006 |

(Continued)

*Primary Examiner* — Sanghyuk Park
(74) *Attorney, Agent, or Firm* — Lewis Roca Rothgerber Christie LLP

(57) ABSTRACT

An organic light-emitting display device including a substrate on which a display area is provided, the display area including a central display area including a first pixel unit, a first edge display area extending from the central display area along a first direction, and a second edge display area including a second pixel unit and extending from the central display area along a second direction that intersects the first direction, and a first signal wiring unit overlapping with the first and second edge display areas, the first signal wiring unit being configured to provide a first scan signal having a first turn-on period to the first pixel unit and to provide a second scan signal having a second turn-on period to the second pixel unit, wherein the first edge display area is bent along a first bending line, which extends along the first direction.

20 Claims, 23 Drawing Sheets

(51) Int. Cl.
    *H01L 51/52*    (2006.01)
    *H01L 27/32*    (2006.01)
    *G09G 3/3233*   (2016.01)
    *G09G 3/3258*   (2016.01)

(56) References Cited

U.S. PATENT DOCUMENTS

| | | | |
|---|---|---|---|
| 2012/0218219 A1* | 8/2012 | Rappoport | H01L 27/3276 345/174 |
| 2016/0116941 A1* | 4/2016 | Kuwabara | G06F 1/163 361/679.03 |
| 2017/0358258 A1 | 12/2017 | Kim et al. | |

FOREIGN PATENT DOCUMENTS

| | | |
|---|---|---|
| KR | 10-0721944 | 5/2007 |
| KR | 10-2014-0076062 | 6/2014 |
| KR | 10-2014-0086509 | 7/2014 |
| KR | 10-1450871 | 10/2014 |
| KR | 10-2017-0139215 | 12/2017 |

\* cited by examiner

FIG. 2B
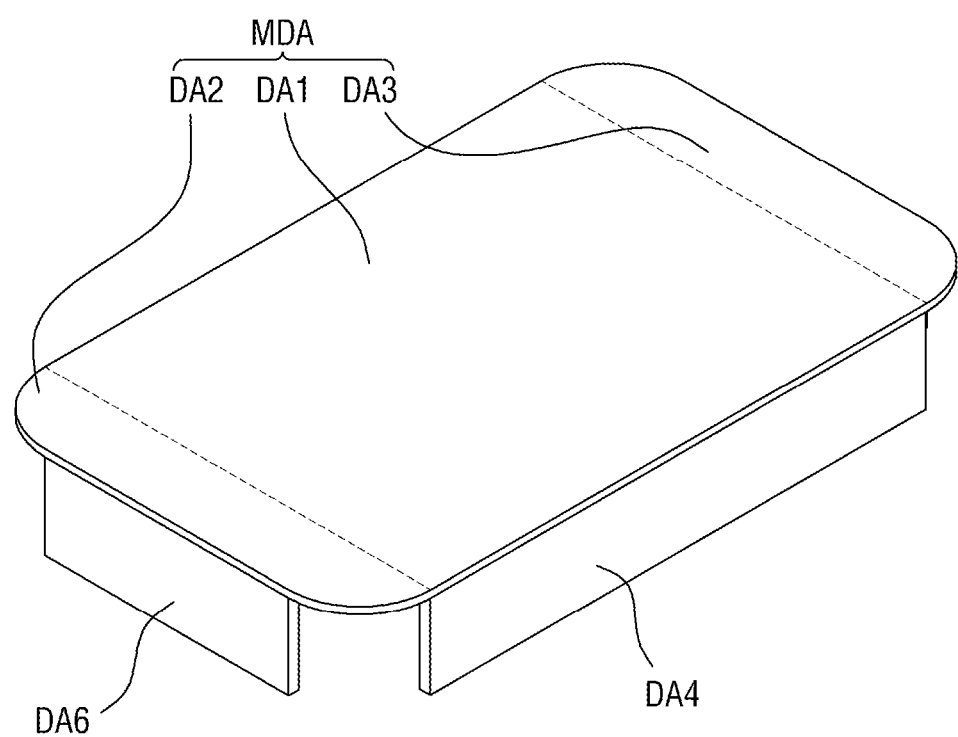
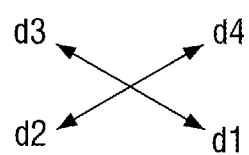

FIG. 3
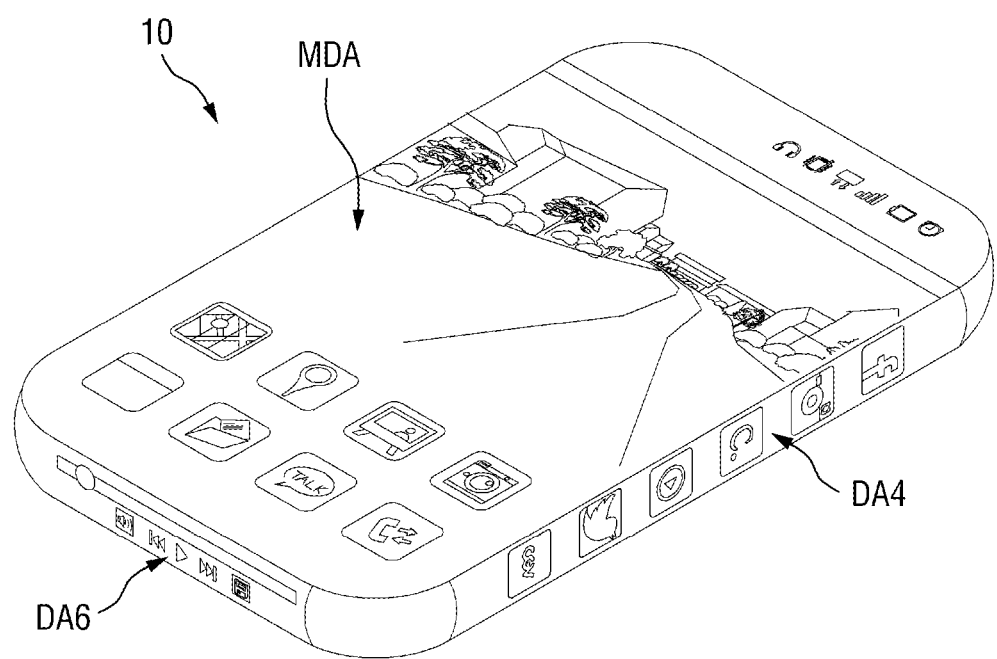
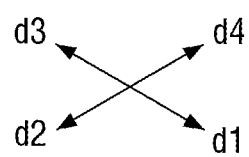

ORGANIC LIGHT-EMITTING DISPLAY DEVICE

CROSS-REFERENCE TO RELATED APPLICATION

This application claims priority to, and the benefit of, Korean Patent Application No. 10-2017-0129748, filed on Oct. 11, 2017 in the Korean Intellectual Property Office, the content of which is herein incorporated by reference in its entirety.

BACKGROUND

1. Field

Aspects of the present disclosure relates to an organic light-emitting display device.

2. Description of the Related Art

Display devices have increasingly become important in accordance with developments in multimedia technology. Accordingly, various types of display devices such as liquid crystal display (LCD) devices, organic light-emitting display devices, and the like have been used.

The organic light-emitting display device displays an image using light-emitting diodes (OLEDs), which generate light through the recombination of electrons and holes. The organic light-emitting display device has many desirable features such as fast response speed, high luminance, wide viewing angle, and low power consumption.

SUMMARY

Aspects of embodiments of the present disclosure are directed to an organic light-emitting display device having a four-side edge structure and capable of improving luminance uniformity between a plurality of display areas thereof.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to some exemplary embodiment of the present disclosure, there is provided an organic light-emitting display device including: a substrate on which a display area is provided, the display area including: a central display area including a first pixel unit; a first edge display area extending from the central display area along a first direction; and a second edge display area including a second pixel unit and extending from the central display area along a second direction that intersects the first direction; and a first signal wiring unit overlapping with the first and second edge display areas, the first signal wiring unit being configured to provide a first scan signal having a first turn-on period to the first pixel unit and to provide a second scan signal having a second turn-on period to the second pixel unit, wherein the first edge display area is bent along a first bending line, which extends along the first direction, wherein the second edge display area is bent along a second bending line, which extends along the second direction, and wherein the first turn-on period is longer than the second turn-on period.

In some embodiments, a pulse amplitude of the first scan signal is greater than a pulse amplitude of the second scan signal.

In some embodiments, the central display area includes a first central display area including the first pixel unit, and a second central display area, which is between the first central display area and the second edge display area and includes a third pixel unit.

In some embodiments, the first signal wiring unit is configured to provide a third scan signal having a third turn-on period to the third pixel unit, and the third turn-on period is shorter than the first turn-on period.

In some embodiments, corner areas of the second central display area are rounded.

In some embodiments, the first signal wiring unit is configured to provide a first emission control signal having a first turn-off period to the first pixel unit and is configured to provide a second emission control signal having a second turn-off period to the second pixel unit, and the first turn-off period is longer than the second turn-off period.

In some embodiments, the display area further includes a third edge display area, which extends from the central display area along a third direction that is opposite to the first direction, and a fourth edge display area, which includes a fourth pixel unit and extends from the central display area along a fourth direction that is opposite to the second direction, the third edge display area is bent along a third bending line, which extends along the second direction, and the fourth edge display area is bent along a fourth bending line, which extends along the first direction.

In some embodiments, the first signal wiring unit is configured to provide a fourth scan signal having a fourth turn-on period to the fourth pixel unit, and the first turn-on period is longer than the fourth turn-on period.

In some embodiments, the organic light-emitting display device further includes: a second signal wiring unit overlapping with the second, third, and fourth edge display areas.

In some embodiments, the first signal wiring unit is connected to the first pixel unit via a first scan line, which is configured to provide the first scan signal, and is connected to the second pixel unit via a second scan line, which is configured to provide the second scan signal, and the first scan line is longer than the second scan line.

According to some exemplary embodiment of the present disclosure, there is provided an organic light-emitting display device including: a substrate on which a display area is provided, the display area including: a central display area including a first pixel unit; a first edge display area extending from the central display area along a first direction; and a second edge display area including a second pixel unit and extending from the central display area along a second direction that intersects the first direction; and a signal wiring unit overlapping with the first and second edge display areas, the signal wiring unit being configured to provide a first scan signal having a first pulse amplitude to the first pixel unit and to provide a second scan signal having a second pulse amplitude to the second pixel unit, wherein the first edge display area is bent along a first bending line, which extends along the first direction, wherein the second edge display area is bent along a second bending line, which extends along the second direction, and wherein the first pulse amplitude is greater than the second pulse amplitude.

In some embodiments, the first scan signal has a first turn-on period, wherein the second scan signal has a second turn-on period, and wherein the first turn-on period is longer than the second turn-on period.

In some embodiments, the signal wiring unit is connected to the first pixel unit via a first scan line, which provides the first scan signal, and is connected to the second pixel unit via a second scan line, which provides the second scan signal, and the first scan line is longer than the second scan line.

In some embodiments, the central display area includes a first central display area including the first pixel unit, and a second central display area, which is between the first central display area and the second edge display area and includes a third pixel unit.

In some embodiments, the signal wiring unit is configured to provide a third scan signal having a third pulse amplitude to the third pixel unit, and the third pulse amplitude is smaller than the first pulse amplitude.

According to some exemplary embodiment of the present disclosure, there is provided an organic light-emitting display device including: a substrate on which a display area is provided, the display area including: a central display area including a first pixel unit; a first edge display area extending from the central display area along a first direction; and a second edge display area including a second pixel unit and extending from the central display area along a second direction that intersects the first direction; and a signal wiring unit overlapping with the first and second edge display areas, the signal wiring unit being connected to the first pixel unit via a first scan line and being connected to the second pixel unit via a second scan line, wherein the signal wiring unit is configured to provide a first scan signal having a first turn-on period to the first pixel unit via the first scan line and to provide a second scan signal having a second turn-on period to the second pixel unit, wherein the first scan line is longer than the second scan line, and wherein the first turn-on period is longer than the second turn-on period.

In some embodiments, a pulse amplitude of the first scan signal is greater than a pulse amplitude of the second scan signal.

In some embodiments, the central display area includes a first central display area, in which the first pixel unit is disposed, and a second central display area, which is disposed between the first central display area and the second edge display area and includes a third pixel unit.

In some embodiments, the signal wiring unit is configured to provide a third scan signal having a third turn-on period to the third pixel unit via a third scan line, the first scan line is longer than the third scan line, and the third turn-on period is shorter than the first turn-on period.

In some embodiments, the signal wiring unit is configured to provide a first emission control signal having a first turn-off period to the first pixel and to provide a second emission control signal having a second turn-off period to the second pixel unit, and the first turn-off period is longer than the second turn-off period.

According to the aforementioned and other exemplary embodiments of the present disclosure, luminance uniformity between a plurality of display areas can be improved (e.g., increased). In addition, vertical and horizontal stripe defects can be addressed.

Other features and exemplary embodiments may be apparent from the following detailed description, the drawings, and the claims.

BRIEF DESCRIPTION OF THE DRAWINGS

The above and other aspects and features of the present disclosure will become more apparent by describing exemplary embodiments thereof in detail with reference to the attached drawings, in which:

FIG. 2B is a side view of the organic light-emitting display device according to an exemplary embodiment of the present disclosure with the fourth through seventh display areas thereof being bent;

FIG. 3 is a perspective view of the organic light-emitting display device according to an exemplary embodiment of the present disclosure;

DETAILED DESCRIPTION

Figure 1:
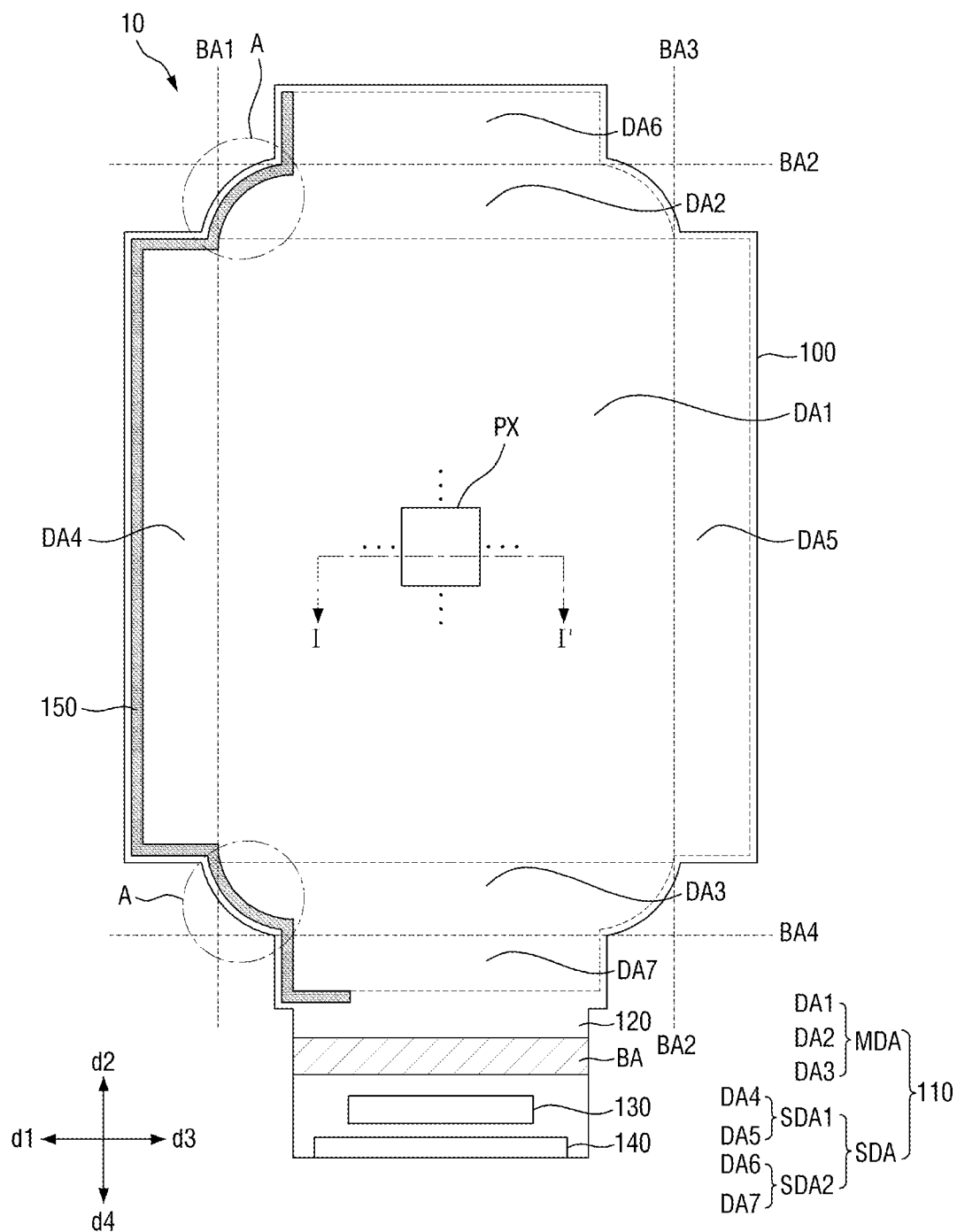
FIG. 1 is a plan view of an organic light-emitting display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a plan view of an organic light-emitting display device according to an exemplary embodiment of the present disclosure.

Referring to FIG. 1, an organic light-emitting display device 10 may include a substrate 100, which has a display area 110 and a non-display area 120, a driver integrated circuit (IC) 130, an output pad 140, and a signal wiring unit 150.

The substrate 100 may be an insulating substrate. In one exemplary embodiment, the substrate 100 may include a material such as glass, quartz, a polymer resin, etc. The material of the polymer resin may include polyethersulphone (PES), polyacrylate (PA), polyarylate (PAR), polyetherimide (PEI), polyethylene naphthalate (PEN), polyethylene terephthalate (PET), polyphenylenesulfide (PPS), polyallylate, polyimide (PI), polycarbonate (PC), cellulose triacetate (CAT), cellulose acetate propionate (CAP), and/or the like.

The substrate 100 may have the display area 110 and the non-display area 120.

The display area 110 is defined as an area in which to display an image. The display area 110 may include a central display area MDA and an edge display area SDA.

The central display area MDA and the edge display area SDA may be separated by first through fourth bending lines BA1 through BA4. For example, the central display area MDA is disposed on the inside of an area defined by the first through fourth bending lines BA1 through BA4 and is a non-bent area. On the other hand, the edge display area SDA is disposed on the outside of the area defined by the first through fourth bending lines BA1 through BA4 and is an area bent along the first through fourth bending lines BA1 through BA4.

The central display area MDA may be divided into first through third display areas DA1 through DA3. The second display area DA2 is disposed adjacent to the first display area DA1 along a second direction d2, and the third display area DA3 is disposed adjacent to the first display area DA1 along a fourth direction d4. In one exemplary embodiment, the first display area DA1 may be rectangular in shape. In one exemplary embodiment, each of the second and third display areas DA2 and DA3 may be rectangular in shape with round corners A. That is, the corners of each of the second and third display areas DA2 and DA3 may be round. In one exemplary embodiment, the round corners A of each of the second and third display areas DA2 and DA3 may be formed by at least partially cutting the substrate 100 using a laser.

However, the shapes of the first, second, and third display areas DA1, DA2, and DA3 are not particularly limited and may encompass an almost rectangular shape or an almost round shape in consideration of process conditions and the like.

The edge display area SDA will hereinafter be described.

The edge display area SDA may include a first edge display area SDA1, which is disposed on left and right sides of the central display area MDA, and a second edge display area SDA2, which is disposed at the top and the bottom of the central display area MDA.

The first edge display area SDA1 may include fourth and fifth display areas DA4 and DA5. The fourth display area DA4 is disposed adjacent to the first display area DA1 along a first direction d1. That is, the fourth display area DA4 may be understood as extending from the first display area DA1 along the first direction d1. The fifth display area DA5 is disposed adjacent to the first display area DA1 along a third direction d3.

The second edge display area SDA2 may include sixth and seventh display areas DA6 and DA7. The sixth display area DA6 is disposed adjacent to the first display area DA1 along the second direction d2, and the seventh display area DA7 is disposed adjacent to the first display area DA1 along the fourth direction d4.

In one exemplary embodiment, the fourth through seventh display areas DA4 through DA7 may be rectangular in shape. In one exemplary embodiment, the fourth display area DA4 may be symmetrical with the fifth display area DA5 with respect to the first display area DA1. In one exemplary embodiment, the sixth display area DA6 may be symmetrical with the seventh display area DA7 with respect to the first display area DA1. However, the shapes of the fourth through seventh display areas DA4 through DA7 are not particularly limited, and the fourth through seventh display areas DA4 through DA7 may have a different shape from one another.

The fourth display area DA4 may be bent along the first bending line BA1 toward the rear of the first display area DA1. The fifth display area DA5 may be bent along the third bending line BA3 toward the rear of the first display area DA1. The sixth display area DA6 may be bent along the second bending line BA2 toward the rear of the first display area DA1, and the seventh display area DA7 may be bent along the fourth bending line BA4 toward the rear of the first display area DA1.

The bent shapes of the fourth through seventh display areas DA4 through DA7 will hereinafter be described with reference to FIGS. 2 and 3.

Figure 2A:
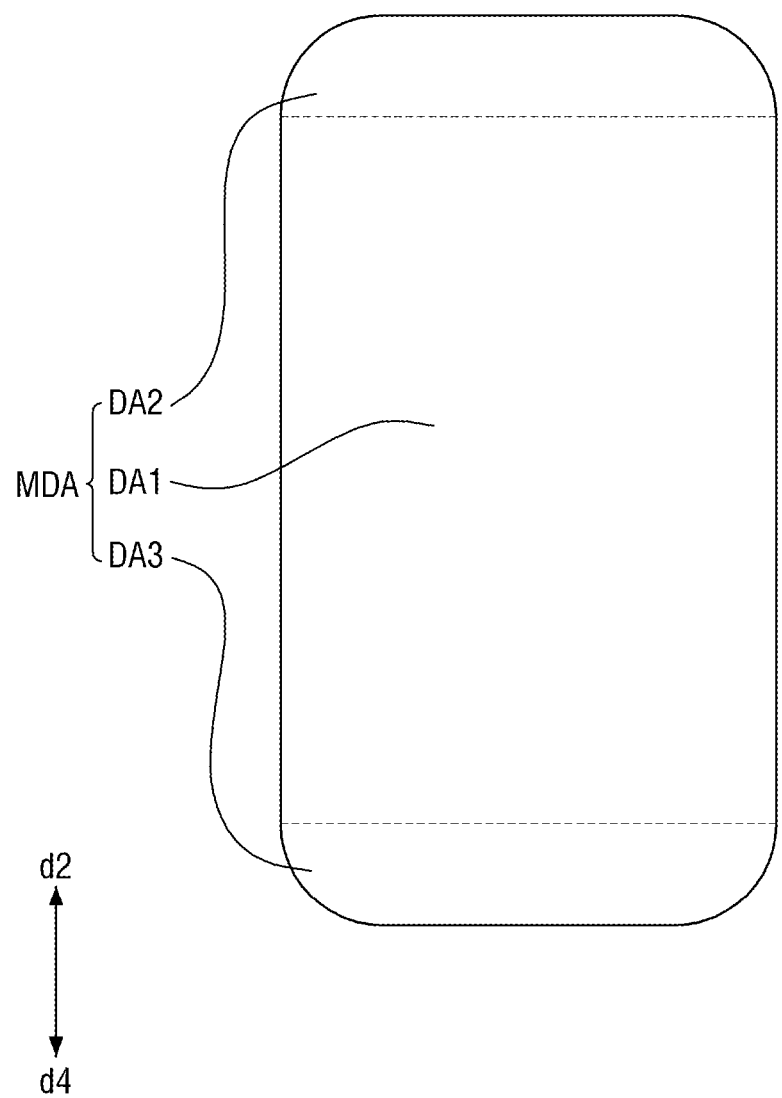
FIG. 2A is a front view of the organic light-emitting display device according to an exemplary embodiment of the present disclosure with fourth through seventh display areas thereof being bent.

FIG. 2A is a front view of the organic light-emitting display device according to an exemplary embodiment of the present disclosure with the fourth through seventh display areas thereof being bent. FIG. 2B is a side view of the organic light-emitting display device according to an exemplary embodiment of the present disclosure with the fourth through seventh display areas thereof being bent. FIG. 3 is a perspective view of the organic light-emitting display device according to an exemplary embodiment of the present disclosure.

Referring to FIGS. 1, 2A, and 2B, only the central display area MDA, that is, the first through third display areas DA1 through DA3, are viewable to a user from the front of the organic light-emitting display device 10. Accordingly, the first through third display areas DA1 through DA3 provide an image to the user in a front direction. The first and second edge display areas SDA1 and SDA2, that is, the fourth through seventh display areas DA4 through DA7, are bent along the first through fourth bending lines BA1 through BA4 toward the rear of the first display area DA1 and are thus not viewable to the user from the front of the organic light-emitting display device 10.

Referring to FIGS. 2A, 2B, and 3, the fourth through seventh display areas DA4 through DA7, which are bent along the first through fourth bending lines BA1 through BA4 toward the rear of the first display area DA1, provide images to the user in side directions. FIGS. 2B and 3 show an example in which the fourth and sixth display areas DA4 and DA6 display images.

The fourth through seventh display areas DA4 through DA7 are bent perpendicularly to the central display area MDA; however, embodiments of the present disclosure are not limited thereto. That is, the fourth through seventh display areas DA4 through DA7 may be bent in a curve with a set or predetermined curvature with respect to the central display area MDA. Also, the fourth through seventh display areas DA4 through DA7 may be bent to overlap with the rear of the central display area MDA.

Because the organic light-emitting display device 10 includes the first through seventh display areas DA1 through DA7, the organic light-emitting display device 10 can display images at the front and all the four sides thereof. In one exemplary embodiment, the central display area MDA and the first and second edge display areas SDA1 and SDA2 may be driven independently of one another. For example, only the central display area MDA may display an image, and the first and second edge display areas SDA1 and SDA2 may not display images. In another example, only part of each of the first and second edge display areas SDA1 and SDA2 may display an image.

Referring again to FIG. 1, the non-display area 120 is disposed on the outside of the display area 110 and is defined as an area in which no image is displayed. In one exemplary embodiment, the non-display area 120 may be disposed to surround the display area 110. FIG. 1 illustrates an example in which the non-display area 120 surrounds the display area 110; however, embodiments of the present disclosure are not limited thereto. In another exemplary embodiment, the non-display area 120 may be disposed adjacent to only one side of the display area 110 or may be disposed adjacent to one or both sides of the display area 110.

The driver IC 130 may be disposed on the non-display area 120. For example, the driver IC 130 may be disposed in part of the non-display area 120 between the seventh display area DA7 and the output pad unit 140 that will be described later. In one exemplary embodiment, the driver IC 130 may be mounted directly on the substrate 100. FIG. 1 illustrates an example in which only one driver IC 130 is provided; however, embodiments of the present disclosure are not limited thereto. That is, in another example, a plurality of driver ICs may be disposed on the non-display area 120.

The driver IC 130 may generate a plurality of data signals based on driving signals provided by the output pad unit 140 and may provide the data signals to a plurality of pixel units (e.g., pixel circuits) PX. To this end, a plurality of input lines, which electrically connect the output pad unit 140 and the driver IC 130, may be disposed on the substrate 100. Also, a plurality of output lines, which electrically connect the central display area MDA, the edge display area SDA, and the driver IC 130, may be disposed on the substrate 100.

A method to electrically connect the input lines, the output lines, and the driver IC 130 is not particularly limited. In one exemplary embodiment, the driver IC 130 may be electrically connected to the input lines and the output lines via an anisotropic conductive film (ACF). In one exemplary embodiment, the ACF may include an adhesive resin and a plurality of conductive particles dispersed in the adhesive resin.

In one exemplary embodiment, the output pad unit 140 may include a plurality of output pads, which extend in the first direction d1 along a side of the substrate 100. The output pad unit 140 may be electrically connected to a printed circuit board (PCB). In one exemplary embodiment, the PCB may be a flexible PCB (FPCB). In a case where the PCB is an FPCB, the area of dead space on the outside of the display area 110 can be reduced or minimized by bending the FPCB toward the rear of the seventh display area DA7.

The output pad unit 140 may provide signals provided by the PCB to the driver IC 130 or directly to the first through seventh display areas DA1 through DA7.

A bending area BA, which overlaps with the non-display area 120, may be disposed on the substrate 100. The bending area BA is defined as an area bent along an imaginary bending line on the bending area BA. In one exemplary embodiment, the bending area BA may be disposed between the seventh display area DA7 and the driver IC 130. That is, the substrate 100 may be bent along the imaginary bending line on the bending area BA. Accordingly, the area of dead space on the outside of the display area 110 can be reduced or minimized. The bending area BA is optional.

The signal wiring unit 150 may be disposed on the non-display area 120. In one exemplary embodiment, the signal wiring unit 150 may be disposed to extend along the sides of the seventh display area DA7, the third display area DA3, the fourth display area DA4, the second display area DA2, and the sixth display area DA6.

The signal wiring unit 150 generate a plurality of driving signals and may provide the plurality of driving signals to the pixel units PX, which are arranged in the first through seventh display areas DA1 through DA7. The types of the plurality of driving signals may vary depending on the arrangement of transistors and an organic light-emitting diode (OLED) in each of the pixel units PX. For example, the plurality of driving signals may include a scan signal capable of turning on the transistors or an emission control signal capable of controlling the emission of light by each of the pixel units PX. In another example, the plurality of driving signals may include both the scan signal and the emission control signal. In one exemplary embodiment, the signal wiring unit 150 may include a plurality of transistors, which are for generating the plurality of driving signals, or may generate the plurality of driving signals via an additional driver IC.

In a case where the signal wiring unit 150 is capable of generating the plurality of driving signals and providing the plurality of driving signals to the first through seventh display areas DA1 through DA7, the arrangement of the signal wiring unit 150 is not particularly limited.

As described above, the types of the plurality of driving signals may vary depending on the arrangement of the transistors and the OLED in each of the pixel units PX. The structure of the pixel units PX and the plurality of driving signals will hereinafter be described with reference to FIGS. 4 through 8.

Figure 4:
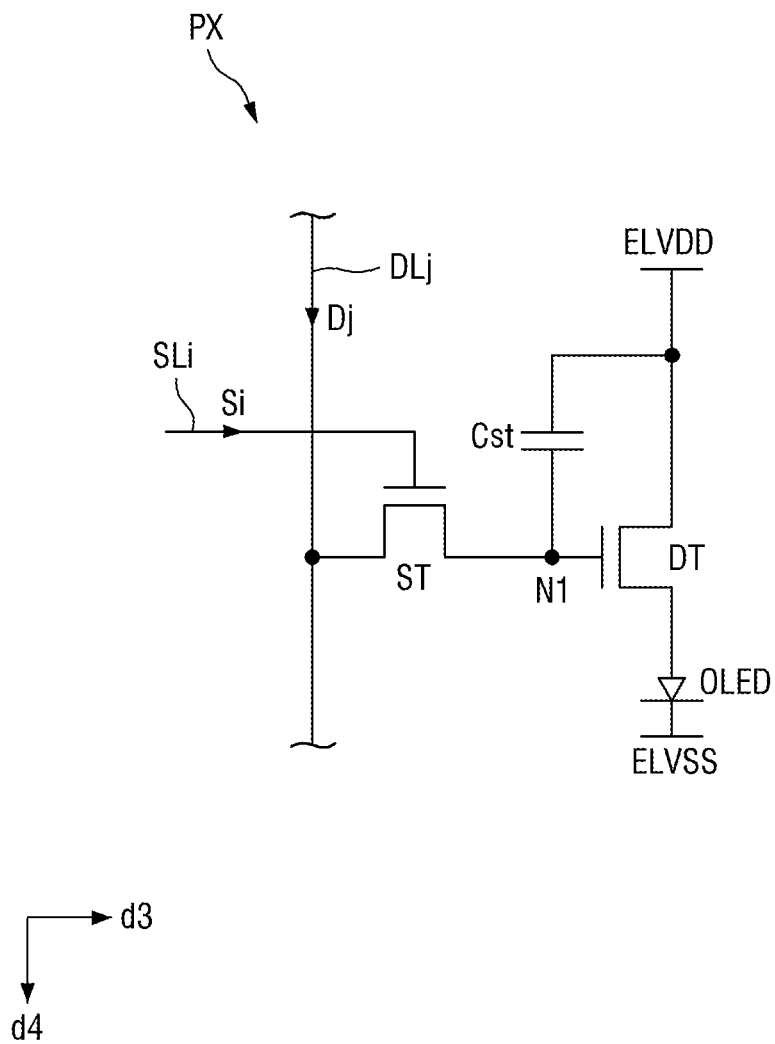
FIG. 4 is an equivalent circuit diagram of an example of a pixel unit illustrated in FIG. 1.

FIG. 4 is an equivalent circuit diagram of an exemplary pixel unit of the organic light-emitting display device 10. For example, FIG. 4 illustrates a pixel unit PX electrically connected to the driver IC 130 via a j-th data line DLj (where j is a natural number equal to or greater than 1) and electrically connected to the signal wiring unit 150 via an i-th scan line SLi (where i is a natural number equal to or greater than 1).

Referring to FIG. 4, the pixel unit PX may include a scan transistor ST, a driving transistor DT, a storage capacitor Cst, and an OLED "OLED".

The scan transistor ST includes a gate electrode electrically connected to the i-th scan line SLi, which extends in the third direction d3, a source electrode connected to the j-th data line DLj, which extends in the fourth direction d4, and a drain electrode connected to a first node N1. The scan transistor ST may perform a switching operation in accordance with an i-th scan signal Si provided by the i-th scan line SLi and may provide a j-th data signal Dj provided by the j-th data line DLj to the first node N1.

The driving transistor DT includes a gate electrode electrically connected to the first node N1, a source electrode provided with (e.g., supplied with) a first driving voltage ELVDD, and a drain electrode connected to a first electrode of the OLED "OLED". A second electrode of the OLED "OLED" is provided with a second driving voltage ELVSS. The first and second driving voltages ELVDD and ELVSS may be direct-current voltages, and the second driving voltage ELVSS may be lower than the first driving voltage ELVDD.

The driving transistor DT may perform a switching operation in accordance with the j-th data signal Dj and may control the amount of current flowing to the OLED "OLED".

The storage capacitor Cst may include a first electrode electrically connected to the first node N1 and a second electrode provided with the first driving voltage ELVDD. The storage capacitor Cst may be charged with a voltage corresponding to the voltage between the first driving voltage ELVDD and a voltage provided to the first node N1.

Because the pixel unit PX of FIG. 4 does not include an emission control transistor, the plurality of driving signals provided by the signal wiring unit 150 to the pixel units PX, which are arranged in the first through seventh display areas DA1 through DA7, may be a plurality of scan signals including the i-th scan signal Si.

Another exemplary pixel unit PX' will hereinafter be described with reference to FIG. 5.

Figure 5:
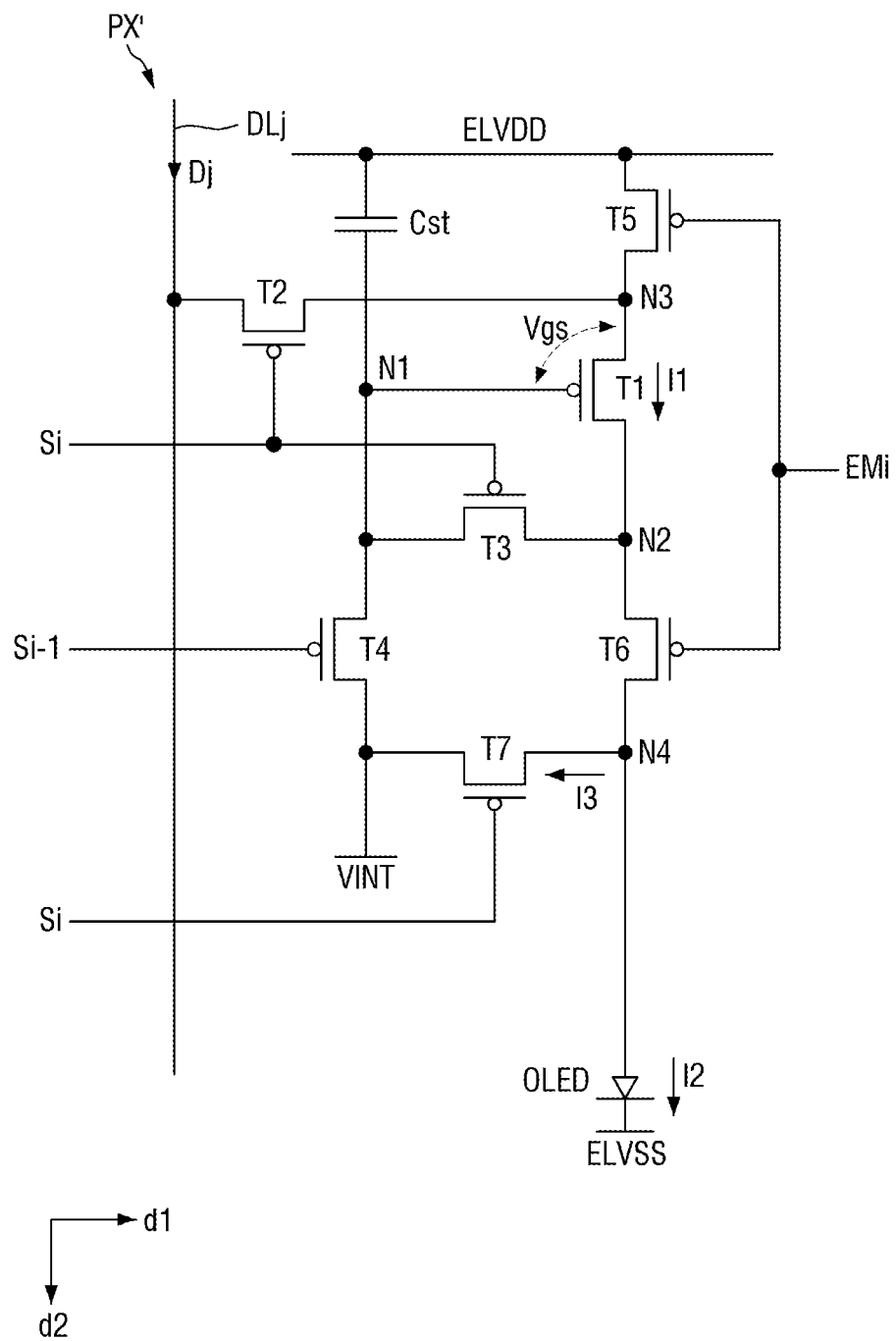
FIG. 5 is an equivalent circuit diagram of another example of a pixel unit illustrated in FIG. 1.

FIG. 5 is an equivalent circuit diagram of another exemplary pixel unit of the organic light-emitting display device 10. For example, FIG. 5 illustrates a pixel unit PX' electrically connected to the driver IC 130 via the j-th data line DLj and electrically connected to the signal wiring unit 150 via a pair of adjacent scan lines, that is, an (i−1)-th scan line and the i-th scan line. The pixel unit PX' is connected to the signal wiring unit 150 via an i-th emission control line EMLi.

Referring to FIG. 5, the pixel unit PX' may include first through seventh transistors T1 through T7, a storage capacitor Cst, and an OLED "OLED". In one exemplary embodiment, the first through seventh transistors T1 through T7 may be P-type metal oxide semiconductor (PMOS) transistors; however, embodiments of the present disclosure are not limited thereto. That is, in another exemplary embodiment, the first through seventh transistors T1 through T7 may be N-type metal oxide semiconductor (NMOS) transistors.

The first transistor T1 may include a gate electrode connected to a first node N1, a source electrode connected to a third node N3, and a drain electrode connected to a second node N2. The second transistor T2 may include a gate electrode receiving an i-th scan signal Si, a source electrode connected to the j-th data line DLj, and a drain electrode connected to the third node N3.

The second transistor T2 may perform a switching operation in accordance with the i-th scan signal Si and may provide a j-th data signal Dj to the source electrode of the first transistor T1 connected to the third node N3. The first transistor T1 may control a driving current I1, provided to the OLED "OLED", in accordance with the j-th data signal Dj.

For example, the first transistor T1 may control the driving current I1 in accordance with the difference in electric potential between the gate electrode and the source electrode thereof, that is, a gate-source voltage Vgs. The first transistor T1 is turned on when the gate-source voltage Vgs is higher than a threshold voltage Vth. Then, when the voltage of the source electrode of the first transistor T1 becomes higher than the threshold voltage of the OLED "OLED", the current between the source electrode and the drain electrode of the first transistor T1, that is, the driving current I1, is provided to the OLED "OLED". That is, the first transistor T1 may be a driving transistor and may correspond to the driving transistor DT of FIG. 4. The second transistor T2 may be a scan transistor and may correspond to the scan transistor ST of FIG. 4.

The third transistor T3 may include a gate electrode provided with (e.g., supplied with) the i-th scan signal Si, a source electrode connected to the drain electrode of the first transistor T1, and a drain electrode connected to the gate electrode of the first transistor T1. The third transistor T3 may perform a switching operation in accordance with the i-th scan signal Si and may connect the source electrode and the gate electrode of the first transistor T1. The third transistor T3 may diode-connect the first transistor T1 through a switching operation and may thus compensate for the threshold voltage Vth of the first transistor T1. That is, the third transistor T3 may be a compensating transistor.

Once the first transistor T1 is diode-connected, a voltage lower than a voltage Vk corresponding to the j-th data signal Dj provided to the source electrode of the first transistor T1 by as much as the threshold voltage Vth of the first transistor T1 may be provided to the gate electrode of the first transistor T1. The voltage provided to the gate electrode of the first transistor T1 will hereinafter be referred to as a threshold voltage-reflected voltage Vk-Vth.

Because the gate electrode of the first transistor T1 is connected to a first electrode of the capacitor Cst, the threshold voltage-reflected voltage Vk-Vth is maintained by the storage capacitor Cst. Because the threshold voltage-reflected voltage Vk-Vth is applied to the gate electrode of the first transistor T1 and is maintained, the driving current I1 that flows in the first transistor T1 is not affected by the threshold voltage Vth of the first transistor T1. Accordingly, any deviation in the threshold voltage Vth of the first transistor T1 can be compensated for, and non-uniformity in luminance can be prevented or reduced.

The fourth transistor T4 may include a gate electrode provided with an (i−1)-th scan signal Si−1, a source electrode provided with an initialization voltage VINT, and a drain electrode connected to the first node N1. The fourth transistor T4 may perform a switching operation in accordance with the (i−1)-th scan signal Si−1 and may provide the initialization voltage VINT to the first node N1. As described above, the first node N1 is connected to the gate electrode of the first transistor T1. The (i−1)-th scan signal Si−1 is a signal provided ahead of (e.g., prior to or in advance of) the i-th scan signal Si.

Accordingly, the fourth transistor T4 may be turned on ahead of the second transistor T2 to provide the initialization voltage VINT to the gate electrode of the first transistor T1. The level of the initialization voltage VINT is not particularly limited as long as the initialization voltage VINT can sufficiently lower the voltage of the gate electrode of the first transistor T1. That is, the fourth transistor T4 may be an initializing transistor.

The fifth transistor T5 may include a gate electrode provided with an i-th emission control signal EMi, a source electrode provided with the first driving voltage ELVDD, and a drain electrode connected to the third node N3. The fifth transistor T5 may perform a switching operation in accordance with the i-th emission control signal EMi and may provide the first driving voltage ELVDD to the source electrode of the first transistor T1, which is connected to the third node N3.

The sixth transistor T6 may include a gate electrode provided with the i-th emission control signal EMi, a source electrode connected to the second node N2, and a drain electrode connected to the fourth node N4. The sixth transistor T6 may perform a switching operation in accordance with the i-th emission control signal EMi and may form a current path via which the driving current I1 can flow toward the OLED "OLED". The OLED "OLED" may emit light in accordance with an emission current I2 corresponding to the driving current I1. That is, the fifth and sixth transistors T5 and T6 may be emission control transistors.

The seventh transistor T7 may include a gate electrode provided with the i-th scan signal Si, a source electrode provided with the initialization voltage VINT, and a drain electrode connected to the fourth node N4. Due to the initialization voltage VINT, a bypass current I3 may flow from the fourth node N4 toward the seventh transistor T7 with the seventh transistor T7 turned off.

Even in a case where a minimum current of the first transistor T1 for displaying a black image flows as the driving current I1, the black image may not be able to be properly displayed when the OLED "OLED" emits light. That is, the seventh transistor T7 may distribute some of the minimum current of the first transistor T1 to a current path other than a current path toward the OLED "OLED" as a bypass current I3. The minimum current of the first transistor T1 refers to the current of the first transistor T1 when the first transistor T1 is turned off because of the gate-source voltage Vgs of the first transistor T1 being lower than the threshold voltage Vth of the first transistor T1. The black image may be displayed by transmitting the minimum current of the first transistor T1 to the OLED "OLED". When a minimum driving current for displaying the black image flows, the influence of the transfer of the bypass current I3 may be significant. On the other hand, when a driving current for displaying an ordinary image or a white image flows, the influence of the bypass current I3 is substantially insignificant. Accordingly, when a driving current for displaying the black image flows, the emission current I2, which is lower than the driving current I1 by as much as the bypass current I3, branched off from the driving current I1, has a minimum level sufficient to properly display the black image. Therefore, the black image can be properly displayed, and as a result, contrast ratio can be improved (e.g., increased). That is, the seventh transistor T7 may be a bypass transistor. Alternatively to what is shown in FIG. 2, the seventh transistor T7 may perform a switching operation in accordance with the (i−1)-th scan signal Si−1, instead of the i-th scan signal Si.

The operation of the pixel unit PX' of FIG. 5 will hereinafter be described with reference to FIGS. 6 through 8.

Figure 6A:
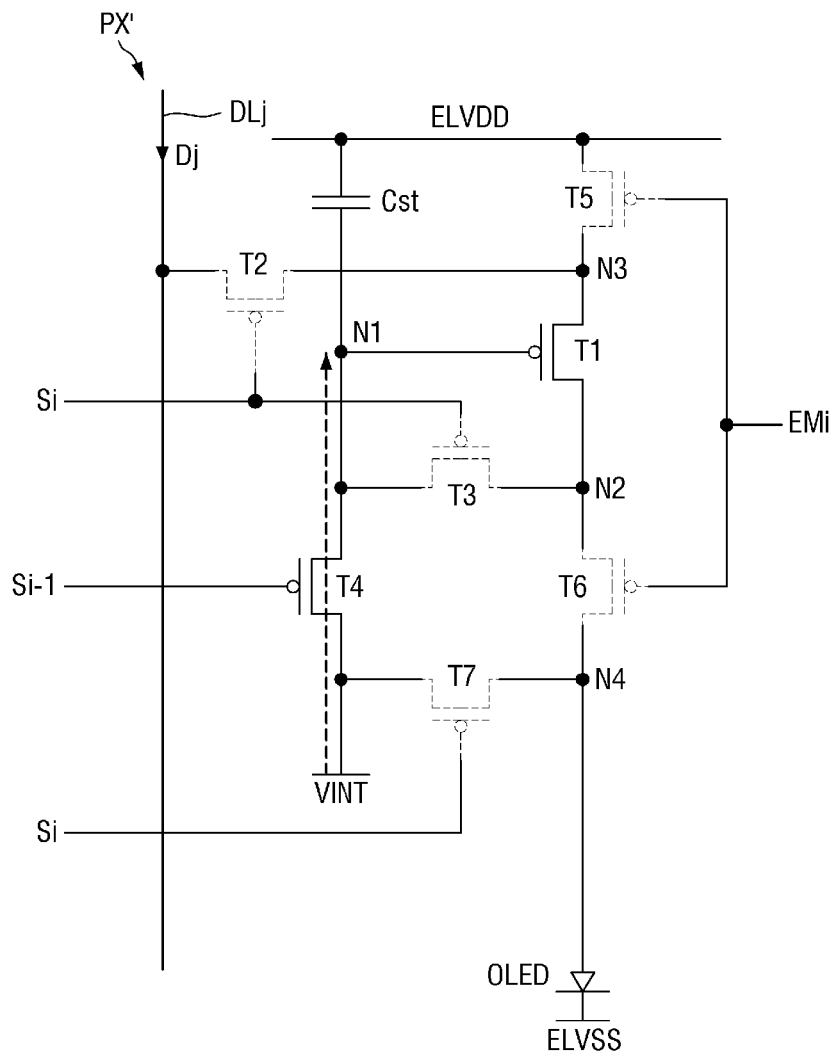
FIGS. 6A, 7A, and 8A are circuit diagrams for illustrating an operation of the pixel unit of FIG. 5.
Figure 6B:
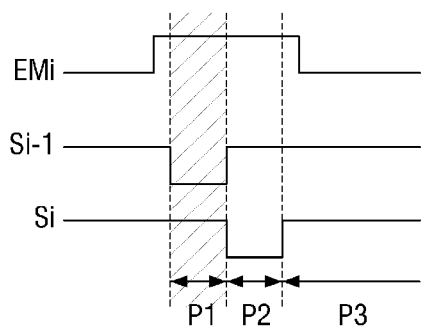
FIGS. 6B, 7B, and 8B are waveform diagrams corresponding to FIGS. 6A, 7A, and 8A, respectively.
Figure 7A:
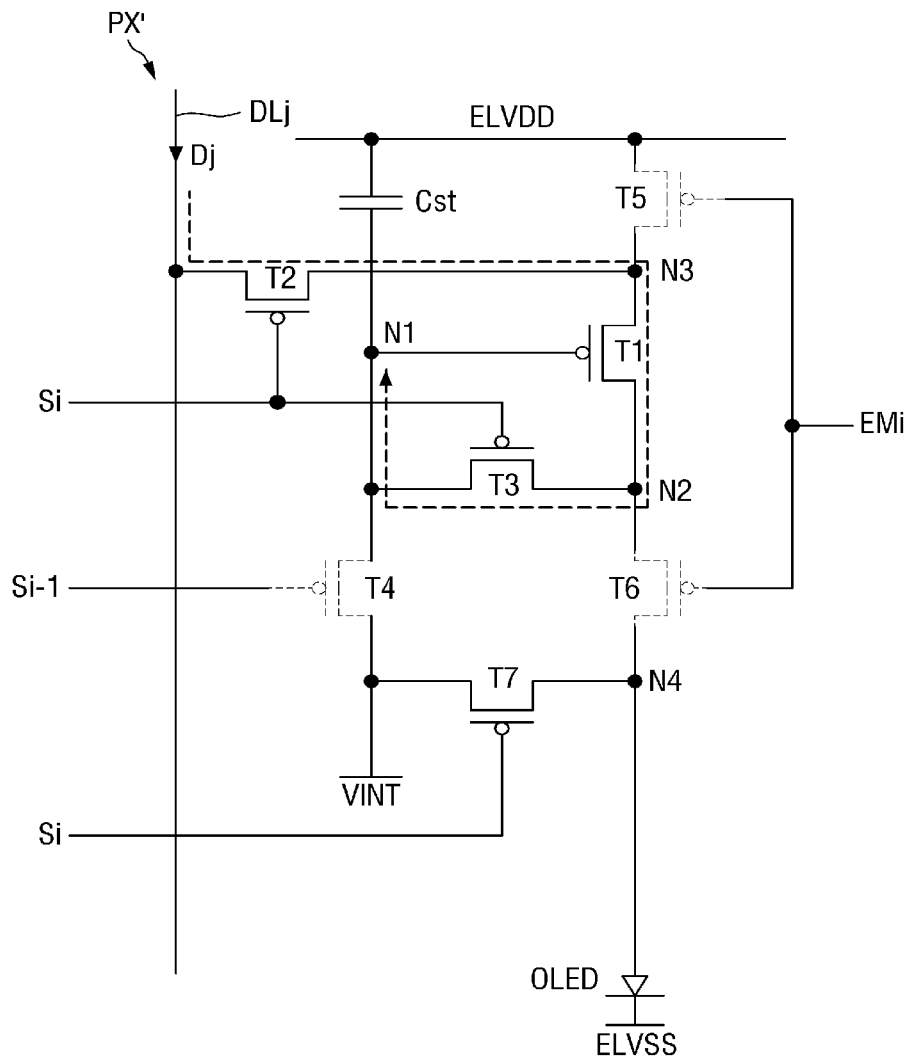
Figure 7B:
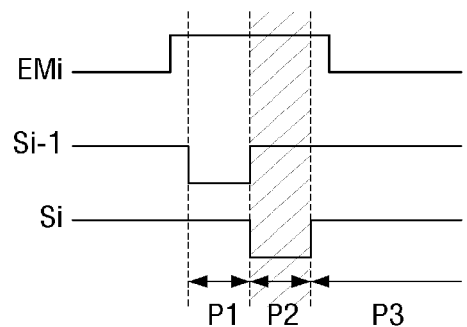
Figure 8A:
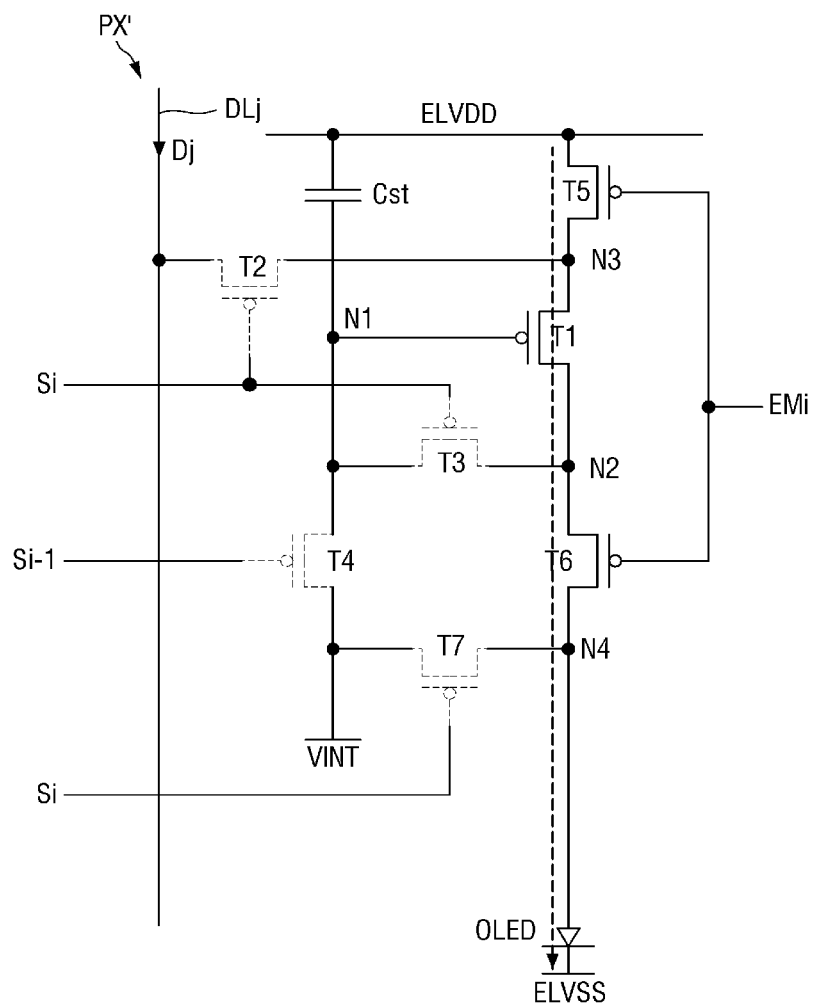
Figure 8B:
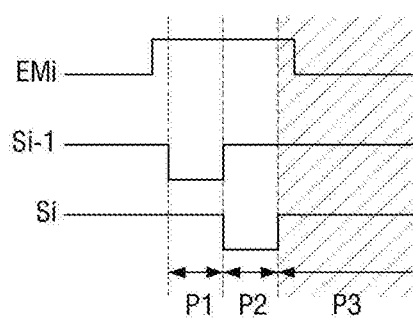

FIGS. 6A, 7A, and 8A are circuit diagrams for illustrating the operation of the pixel unit of FIG. 5. FIGS. 6B, 7B, and 8B are waveform diagrams corresponding to FIGS. 6A, 7A, and 8A, respectively.

Referring to FIGS. 6A-6B, in a first driving period P1, the (i−1)-th scan signal Si−1 is switched from a high level to a low level, and the i-th scan signal Si and the i-th emission control signal EMi are maintained at the high level.

In response to the (i−1)-th scan signal Si−1 being switched from the high level to the low level, the fourth transistor T4 is turned on. The fourth transistor T4 may provide the initialization voltage VINT to the first node N1. The initialization voltage VINT may be set to be low enough to initialize the first node N1. Because the gate electrode of the fourth transistor T4 is electrically connected to the first node N1, the gate electrode of the fourth transistor T4 is set to the initialization voltage VINT.

Referring to FIGS. 7A-7B, in a second driving period P2, the i-th scan signal Si is switched from the high level to the low level, the (i−1)-th scan signal Si−1 is switched from the low level to the high level, and the i-th emission control signal EMi is maintained at the high level.

Accordingly, the second, third, and seventh transistors T2, T3, and T7 are turned on, and the fourth transistor T4 is turned off. In response to the third transistor T3 being turned on, the first transistor T1 is diode-connected. The j-th data signal Dj, which is provided from the j-th data line DLj via the second transistor T2, is provided to the first node N1 via the third node N3 and the third transistor T3. Because the first transistor T1 is diode-connected, the first node N1 is provided with a differential voltage corresponding to the difference between the voltage corresponding to the j-th data signal Dj and the threshold voltage Vth of the first transistor T1. That is, the first node N1 is provided with a voltage lower than the voltage corresponding to the j-th data signal Dj by as much as the threshold voltage Vth of the first transistor T1.

The storage capacitor Cst stores electric charge corresponding to the difference between the differential voltage provided to the first node N1 and the first driving voltage ELVDD. In response to the seventh transistor T7 being turned on, the fourth node N4 is set to the initialization voltage VINT.

Referring to FIGS. 8A-8B, a third driving period P3 is defined as an emission period. In the third driving period P3, the (i−1)-th scan signal Si−1 is maintained at the high level, and the i-th scan signal Si is switched from the low level to the high level. Then, the i-th emission control signal EMi is switched from the high level to the low level.

Accordingly, the fifth and sixth transistors T5 and T6 are turned on, and the second, third, and seventh transistors T2, T3, and T7 are turned off. In response to the fifth and sixth transistors T5 and T6 being turned on, the driving current I1 flows from the first driving voltage ELVDD to the OLED "OLED" via the fifth transistor T5, the first transistor T1, and the sixth transistor T6.

The pixel unit PX' of FIG. 5 includes the second transistor T2, which corresponds to a scan transistor, and the fifth and sixth transistors T5 and T6, which correspond emission control transistors. Accordingly, a plurality of scan signals including the i-th scan signal Si and a plurality of emission control signals including the i-th emission control signal EMi may be provided from the signal wiring unit 150 to a plurality of pixel units PX' (including the pixel unit PX' of FIG. 5) in the first through seventh display areas DA1 through DA7 as driving signals.

The pixel unit PX or PX' of FIG. 4 or 5 may be provided with the first and second driving voltages ELVDD and ELVSS. The first and second driving voltages ELVDD and ELVSS may be provided by a power provider via an additional driving voltage line. The signal wiring unit 150 may include the driving voltage line. The driving voltage line may be disposed adjacent to the signal wiring unit 150.

The stack structure of the elements of the organic light-emitting display device 10 will hereinafter be described, taking, for example, the pixel unit PX' of FIG. 5, and any repetitive description of the exemplary embodiment of FIGS. 1 through 8 may be omitted.

Figure 9:
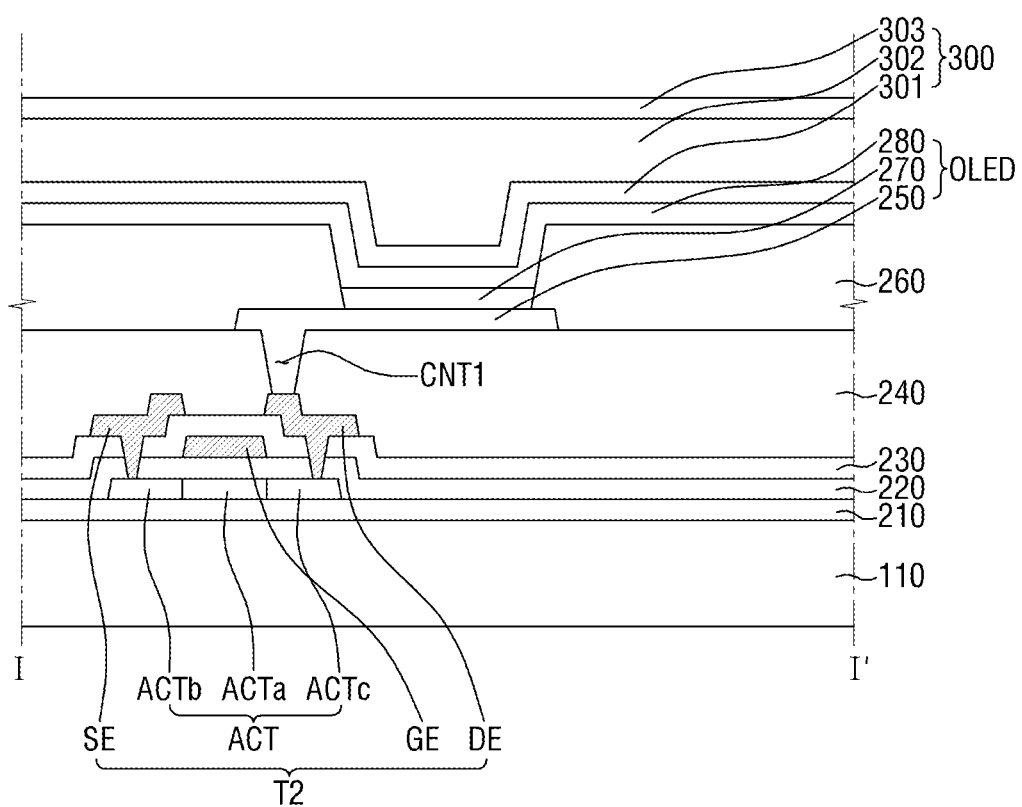
FIG. 9 is a cross-sectional view taken along the line I-I' of FIG. 1.

FIG. 9 is a cross-sectional view taken along the line I-I' of FIG. 1.

Referring to FIG. 9, a buffer layer 210 may be disposed on the substrate 100. The buffer layer 210 may prevent or reduce the infiltration of moisture and oxygen from the outside through the substrate 100. The buffer layer 210 may planarize the surface of the substrate 100. In one exemplary embodiment, the buffer layer 210 may include one of a nitride silicon (SiNx) film, a silicon oxide (SiO$_2$) film, and a silicon oxynitride (SiOxNy) film. The buffer layer 210 may be optional and thus may not be provided depending on the type of the substrate 100 or processing conditions.

A semiconductor layer including a semiconductor pattern ACT may be disposed on the buffer layer 210. The semiconductor layer will hereinafter be described, taking the semiconductor pattern ACT. In one exemplary embodiment, the semiconductor pattern ACT may be formed by mixing one or more selected from among polycrystalline silicon, monocrystalline silicon, low-temperature polycrystalline silicon, amorphous silicon, and an oxide semiconductor. In one exemplary embodiment, the semiconductor pattern ACT may include a channel area ACTa, which is not doped with impurities, and source and drain areas ACTb and ACTc, which are doped with impurities. The source area ACTb is disposed on one side of the channel area ACTa and is electrically connected to a source electrode SE, which will be described later. The drain area ACTc is disposed on the other side of the channel area ACTa and is electrically connected to a drain electrode DE, which will be described later.

A first insulating layer 220 may be disposed on the semiconductor layer including the semiconductor pattern ACT. In one exemplary embodiment, the first insulating layer 220 may be a gate insulating layer. In one exemplary embodiment, the first insulating layer 220 may be formed by mixing at least one selected from the group consisting of an inorganic insulating material, such as silicon oxide (SiOx), silicon nitride (SiNx), or the like, and an organic insulating material, such as benzocyclobutene (BCB), an acrylic material, polyimide (PI), or the like.

A gate conductor including a gate electrode GE may be disposed on the first insulating layer 220. The gate electrode GE is the gate electrode of the first transistor T1 of FIG. 5. The gate conductor may include the i-th scan line SLi of FIG. 5. The gate electrode GE may extend from the i-th scan line SLi and may overlap with the semiconductor pattern ACT. The gate conductor may include an aluminum (Al)-based metal including an Al alloy, a silver (Ag)-based metal including an Ag alloy, a copper (Cu)-based metal including a Cu alloy, a molybdenum (Mo)-based metal including a Mo alloy, chromium (Cr), titanium (Ti), tantalum (Ta), and/or the like.

A second insulating layer 230 may be disposed on the gate conductor including the gate electrode GE. The second insulating layer 230 may be formed by mixing at least one selected from the group consisting of an inorganic insulating material, such as silicon oxide (SiOx), silicon nitride (SiNx), or the like, and an organic insulating material, such as BCB, an acrylic material, PI, or the like.

A data conductor including the source electrode SE and the drain electrode DE may be disposed on the second insulating layer 230. The source electrode SE is the source electrode of the first transistor T1 of FIG. 5. The drain electrode DE is the drain electrode of the first transistor T1 of FIG. 5.

The data conductor may include not only the j-th data line DLj of FIG. 2, but also the driving voltage line via which the first and second driving voltages ELVDD and ELVSS are provided. The source electrode SE and the drain electrode DE may be disposed on the second insulating layer 230 to be spaced apart from each other. The data conductor may include at least one selected from the group consisting of a metal, an alloy, a metal nitride, a conductive metal oxide, and a transparent conductive material. In one exemplary embodiment, the data conductor may include nickel (Ni), cobalt (Co), titanium (Ti), Ag, Cu, Mo, Al, beryllium (Be), niobium (Nb), gold (Au), iron (Fe), selenium (Se), and/or the like and may have a single- or multilayer structure. In some examples, an alloy of at least one selected from the group consisting of Ti, zirconium (Zr), tungsten (W), Ta, Nb, platinum (Pt), hafnium (Hf), oxygen (O), and nitrogen (N) may be used as the material of the source electrode SE and the drain electrode DE.

The semiconductor pattern ACT, the gate electrode GE, the source electrode SE, and the drain electrode DE may form the first transistor T1 of FIG. 5.

A planarization layer 240 may be disposed on the data conductor. The planarization layer 240 eliminates any height difference therebelow and can thus improve (e.g., increase) the emission efficiency of a pixel electrode 250 and an organic light-emitting layer 270, which will be described later. In one exemplary embodiment, the planarization layer 240 may include an organic material. In one example, the planarization layer 240 may include PI, polyacryl, polysiloxane, and/or the like. In another example, the planarization layer 240 may include an inorganic material or the combination of an inorganic material and an organic material. A first contact hole (i.e., a first contact opening) CNT1 may be formed in the planarization layer 240 to at least partially expose the drain electrode DE.

The pixel electrode 250 may be disposed on the planarization layer 240. The pixel electrode 250 may be electrically connected to part of the drain electrode DE exposed by the first contact hole CNT1. That is, the pixel electrode 250 may be an anode, which is a hole injection electrode. In a case where the pixel electrode 250 is an anode electrode, the pixel electrode 250 may include a material having a high work function so as to facilitate the injection of holes. Also, the pixel electrode 250 may be a reflective electrode, a trans-flective electrode, or a transmissive electrode. In one exemplary embodiment, the pixel electrode 250 may include a reflective material. In one exemplary embodiment, the reflective material may include at least one selected from the group consisting of Ag, magnesium (Mg), Cr, Au, Pt, Ni, Cu, W, Al, Al-lithium (Al—Li), Mg-indium (Mg—In), and Mg—Ag.

In one exemplary embodiment, the pixel electrode 250 may be formed as a single layer; however, embodiments of the present disclosure are not limited thereto. That is, in some examples, the pixel electrode 250 may be formed as a multilayer having a stack of two different materials.

In one exemplary embodiment, in a case where the pixel electrode 250 is formed as a multilayer, the pixel electrode 250 may include a reflective film and a transparent or transflective electrode disposed on the reflective film. In another exemplary embodiment, the pixel electrode 250 may include a reflective film and a transparent or transflective electrode disposed below the reflective film. For example, the pixel electrode 250 may have a triple-layer structure of indium tin oxide (ITO)/Ag/ITO; however, embodiments of the present disclosure are not limited thereto.

Here, the transparent or transflective electrode may include at least one selected from the group consisting of ITO, indium zinc oxide (IZO), zinc oxide (ZnO), indium oxide ($In_2O_3$), indium gallium oxide (IGO), and aluminum zinc oxide (AZO).

A pixel defining film 260 may be disposed on the pixel electrode 250. The pixel defining film 260 may include an opening, which at least partially exposes the pixel electrode 250. The pixel defining film 260 may include an organic material or an inorganic material. In one exemplary embodiment, the pixel defining film 260 may include photoresist, a PI-based resin, an acrylic resin, a silicon compound, or a polyacrylic resin.

The organic light-emitting layer 270 may be disposed on the pixel electrode 250 and the pixel defining film 260. For example, the organic light-emitting layer 270 may be disposed on part of the pixel electrode 250 exposed by the opening of the pixel defining film 260. In one exemplary embodiment, the organic light-emitting layer 270 may at least partially cover the sidewalls of the pixel defining film 260.

In one exemplary embodiment, the organic light-emitting layer 270 may emit one of red, blue, and green colors. In another exemplary embodiment, the organic light-emitting layer 270 may emit a white color or one of cyan, magenta, and yellow colors. In a case where the organic light-emitting layer 270 emits a white color, the organic light-emitting layer 270 may include a white light-emitting material or may have a stack of red, green, and blue light-emitting layers.

A common electrode 280 may be disposed on the organic light-emitting layer 270 and the pixel defining film 260. In one exemplary embodiment, the common electrode 280 may be formed on the entire surfaces of the organic light-emitting layer 270 and the pixel defining film 260. In one exemplary embodiment, the common electrode 280 may be a cathode. In one exemplary embodiment, the common electrode 280 may include at least one selected from the group consisting of Li, calcium (Ca), lithium fluoride (LiF)/Ca, LiF/Al, Al, Ag, and Mg. The common electrode 280 may be formed of a material with a low work function. In one exemplary embodiment, the common electrode 280 may be a transparent or transflective electrode formed of at least one selected from the group consisting of ITO, IZO, ZnO, $In_2O_3$, IGO, and AZO.

The pixel electrode 250, the organic light-emitting layer 270, and the common electrode 280 may form an OLED "OLED"; however, embodiments of the present disclosure are not limited thereto. That is, the OLED "OLED" may have a multilayer structure and may further include a hole injection layer (HIL), a hole transport layer (HTL), an electron transport layer (ETL), and an electron injection layer (EIL).

An encapsulation layer 300 may be disposed to face the substrate 100 and may cover the OLED "OLED". The encapsulation layer 300 may prevent or reduce the infiltration of moisture and air from the outside into the OLED "OLED". In one exemplary embodiment, the encapsulation layer 300 may include a first inorganic layer 301, an organic layer 302, and a second inorganic layer 303.

The first inorganic layer 301 may be disposed on the common electrode 280. The first inorganic layer 301 may include at least one selected from the group consisting of silicon oxide (SiOx), silicon nitride (SiNx), and silicon oxynitride (SiONx).

The organic layer 302 may be disposed on the first inorganic layer 301. The organic layer 302 may include one selected from the group consisting of epoxy, acrylate, or urethane acrylate. The organic layer 302 may planarize a height difference formed by the pixel defining film 260.

The second inorganic layer 303 may be disposed on the organic layer 302. The second inorganic layer 303 may include at least one selected from the group consisting of silicon oxide (SiOx), silicon nitride (SiNx), and silicon oxynitride (SiONx).

FIG. 9 illustrates an example in which the first inorganic layer 301, the organic layer 302, and the second inorganic layer 303 all have a single-layer structure, but the present disclosure is not limited thereto. That is, at least one of the first inorganic layer 301, the organic layer 302, and the second inorganic layer 303 may be formed to have a multilayer structure.

In another exemplary embodiment, the encapsulation layer 300 may include a hexamethyldisiloxane (HMDSO) layer. For example, the encapsulation layer 300 may include the first and second inorganic layers 301 and 303 and may further include an HMDSO layer disposed between the first and second inorganic layers 301 and 303. That is, the organic layer 302 may be replaced with the HMDSO layer.

In one exemplary embodiment, after the formation of the first inorganic layer 301, the HMDSO layer may be formed in the same chamber as the first inorganic layer 301. In this manner, the formation of the encapsulation layer 300 can be simplified. Also, because the encapsulation layer 300 includes the HMDSO layer, which is capable of absorbing stress, the encapsulation layer 300 can have sufficient flexibility.

In some examples, the encapsulation layer 300 may be a transparent insulating substrate. The transparent insulating substrate may be a glass substrate, a quartz substrate, a transparent resin substrate, and/or the like. In a case where the encapsulation layer 300 is a transparent insulating substrate, the encapsulation layer 300 may be coupled to the substrate 100 via an additional sealing member.

A polarization layer, an input sensing layer, and a window layer may be disposed on the encapsulation layer 300.

The polarization layer may reduce the reflectance of external light incident thereupon from the outside. In one exemplary embodiment, the polarization layer may include a retarder and a polarizer. The polarizer is optional and thus may not be provided. In a case where the polarizer is not provided, a black matrix and a color filter may be disposed on the encapsulation layer 300 to address color separation that may be caused by the reflection of external light.

In one exemplary embodiment, the input sensing layer may be formed directly on the encapsulation layer 300. In another exemplary embodiment, the input sensing layer may be coupled to the encapsulation layer 300 via an additional adhesive member.

The characteristics of driving signals of the organic light-emitting display device 10 and how to compensate for the characteristics of the driving signals will hereinafter be described.

First, the characteristics of driving signals output from the signal wiring unit 150 will hereinafter be described with reference to FIGS. 10A and 10B.

Figure 10A:
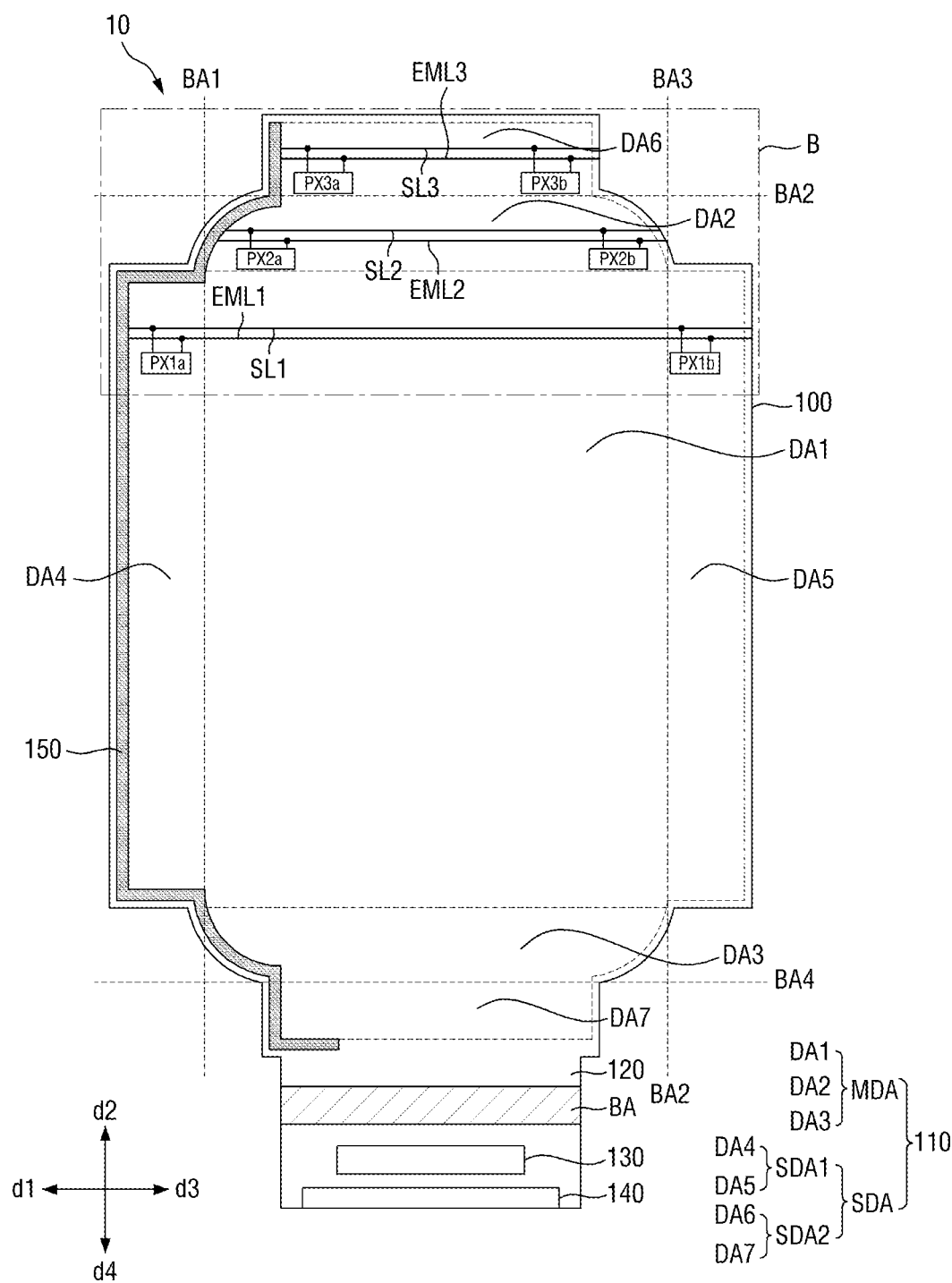
FIG. 10A is a plan view for illustrating the characteristics of driving signals of the organic light-emitting display device according to an exemplary embodiment of the present disclosure.

FIG. 10A is a plan view for illustrating the characteristics of driving signals of the organic light-emitting display device according to an exemplary embodiment of the present disclosure. FIG. 10B is an enlarged plan view of an area B of FIG. 10A. The characteristics of driving signals of the organic light-emitting display device according to an exemplary embodiment of the present disclosure will hereinafter be described, taking, for example, the area B of FIG. 10A, particularly, 1a-th, 1b-th, 2a-th, 2b-th, 3a-th, and 3b-th pixel units PX1a, PX1b, PX2a, PX2b, PX3a, and PX3b, first, second, and third scan lines SL1, SL2, and SL3, and first, second, and third emission control lines EML1, EML2, and EML3. Here, the terms "1a-th", "1b-th", "2a-th", "2b-th", "3a-th", and "3b-th" and "first", "second", and "third" are used to describe pixels and scan lines and emission control lines connected to the pixels and should not be construed as limiting, for example, the arrangement of the pixels, the scan lines, the emission control lines. In the description that follows, it is assumed that the 1a-th, 1b-th, 2a-th, 2b-th, 3a-th, and 3b-th pixel units PX1a, PX1b, PX2a, PX2b, PX3a, and PX3b have the same structure as the pixel unit PX' of FIG. 5.

Figure 10B:
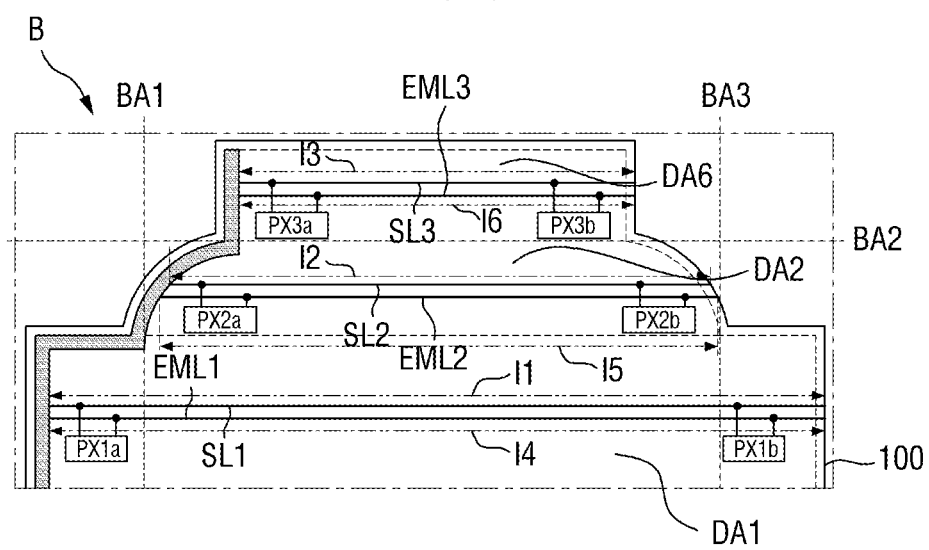
FIG. 10B is an enlarged plan view of an area B of FIG. 10A.

Referring to FIGS. 10A and 10B, the first scan line SL1 may extend from the signal wiring unit 150 along the third direction d3. The first scan line SL1 may be disposed to overlap with the fourth display area DA4, the first display area DA1, and the fifth display area DA5. The first scan line SL1 may be electrically connected to a plurality of pixel units disposed in each of the fourth display area DA4, the first display area DA1, and the fifth display area DA5. That is, the first scan line SL1 may overlap with the fourth and fifth display areas DA4 and DA5, which are bent along the first and third bending lines BA1 and BA3, respectively, and may thus be bent in at least two areas The second scan line SL2 may extend from the signal wiring unit 150 along the third direction d3 and may be disposed to overlap with the second display area DA2. The third scan line SL3 may extend from the signal wiring unit 150 along the third direction d3 and may be disposed to overlap with the sixth display area DA6.

Because the first scan line SL1 overlaps with all the fourth display area DA4, the first display area DA1, and the fifth display area DA5, a length l1 of the first scan line SL1 may be greater than a length l2 of the second scan line SL2 and a length l3 of the third scan line SL3. The width of the second display area DA2 may be greater than the width of the sixth display area DA6. Accordingly, the length l2 of the second scan line SL2, which overlaps with the second display area DA2, may be greater than the length l3 of the third scan line SL3, which overlaps with the sixth display area DA6.

That is, because the first, second, and third scan lines SL1, SL2, and SL3 have different lengths, slew rate may differ between first, second, and third scan signals S1, S2, and S3 output from the first, second, and third scan lines SL1, SL2, and SL3, respectively, and this will hereinafter be described in further detail.

The 1a-th pixel unit PX1a is connected to the first scan line SL1 and is the first pixel unit provided with the first scan signal S1 with a turn-on voltage, ahead of other pixel units connected to the first scan line SL1, and the 1b-th pixel unit PX1b is connected to the first scan line SL1 and is the last pixel unit provided with the first scan signal S1 with the turn-on voltage.

Because the 1b-th pixel unit PX1b is provided with the first scan signal S1 with the turn-on voltage later than the 1a-th pixel unit PX1a, the slew rate of the first scan signal S1 may differ from the 1a-th pixel unit PX1a to the 1b-th pixel unit PX1b. Accordingly, the 1b-th pixel unit PX1b may not be able to secure a sufficient amount of time to receive a data signal from a data line connected thereto, that is, a turn-on period, which is defined as a period of time during which the turn-on voltage is provided to a transistor that receives a scan signal. In a case where the turn-on period of the 1b-th pixel unit PX1b, particularly, the turn-on period of the second transistor (T2 of FIG. 5) of the 1b-th pixel unit PX1b, is not secured, the 1b-th pixel unit PX1b may not be able to sufficiently receive a data signal and may thus cause poor display quality.

Differences in slew rate may also occur between the 2a-th and 2b-th pixel units PX2a and PX2b, which are connected to the second scan line SL2, and between the 3a-th and 3b-th pixel units PX3a and PX3b, which are connected to the third scan line SL3.

Slew rate is affected by the length of a scan line. Thus, slew rate may also differ between the 1b-th, 2b-th, and 3b-th pixel units PX1b, PX2b, and PX3b, which are connected to the first, second, and third scan lines SL1 through SL3, respectively, having different lengths.

The first emission control line EML1 may extend from the signal wiring unit 150 along the third direction d3. The first emission control line EML1 may be disposed to overlap with the fourth display area DA4, the first display area DA1, and the fifth display area DA5. The first emission control line EML1 may be electrically connected to the plurality of pixel units in each of the fourth display area DA4, the first display area DA1, and the fifth display area DA5. The first emission control line EML1 may overlap with the fourth and fifth display areas DA4 and DA5, which are bent along the first and third bending lines BA1 and BA3, respectively, and may thus be bent in the at least two areas.

The second emission control line EML2 may extend from the signal wiring unit 150 along the third direction d3 and may be disposed to overlap with the second display area DA2. The third emission control line EML3 may extend from the signal wiring unit 150 along the third direction d3 and may be disposed to overlap with the sixth display area DA6.

A first emission control signal EM1, which is provided from the first emission control line EML1 to the 1a-th and 1b-th pixel units PX1a and PX1b, a second emission control signal EM2, which is provided from the second emission control line EML2 to the 2a-th and 2b-th pixel units PX2a and PX2b, and a third emission control signal EM3, which is provided from the third emission control line EML3 to the 3a-th and 3b-th pixel units PX3a and PX3b, may have different slew rates. This may be because the first, second, and third emission control lines EML1, EML2, and EML3 have different lengths (i.e., lengths l4, l5, and l6), and the 1a-th, 1b-th, 2a-th, 2b-th, 3a-th, and 3b-th pixel units PX1a, PX1b, PX2a, PX2b, PX3a, and PX3b have different locations.

An exemplary method of compensating for differences in slew rate will hereinafter be described with reference to FIGS. 11 through 14.

FIGS. 11 through 14 are plan views for illustrating how the organic light-emitting display device according to an exemplary embodiment of the present disclosure compensates for differences in slew rate.

Figure 11A:
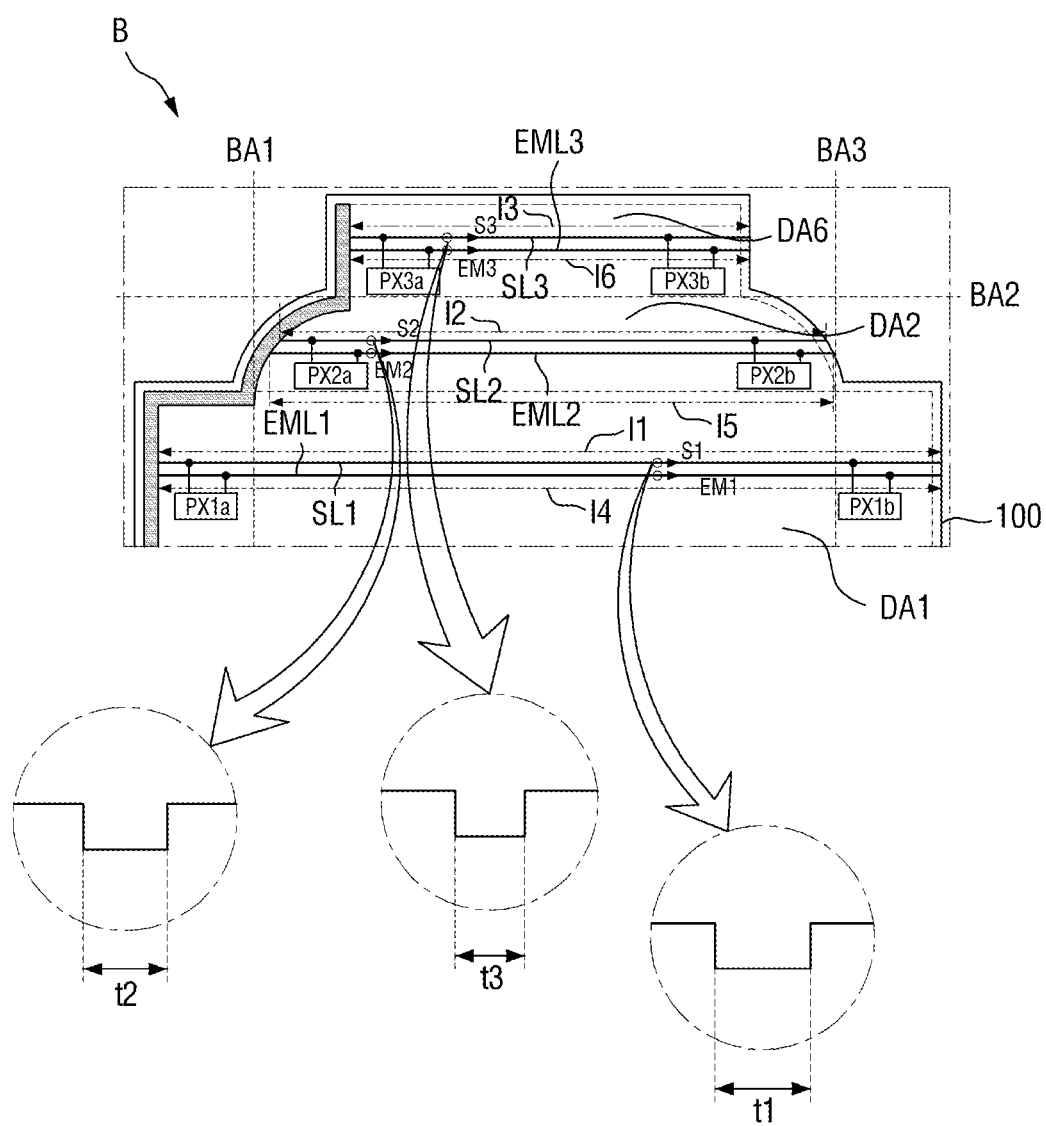
FIGS. 11-14 are plan views for illustrating how the organic light-emitting display device according to an exemplary embodiment of the present disclosure compensates for differences in slew rate.

Referring to FIG. 11A, the signal wiring unit 150 may control the turn-on period of a scan signal provided to a scan line in consideration of the length of the scan line. For example, the signal wiring unit 150 may control the turn-on period of a scan signal provided to a relatively long scan line to be longer than the turn-on period of a scan signal provided to a relatively short scan line.

For example, a turn-on period t1 of the first scan signal S1 provided to the first scan line SL1 is longer than a turn-on period t2 of the second scan signal S2 provided to the second scan line SL2 and a turn-on period t3 of the third scan signal S3 provided to the third scan line SL3. The turn-on period t2 of the second scan signal S2 may be longer than the turn-on period t3 of the third scan signal S3.

The lengths of the turn-on periods t1, t2, and t3 of the first, second, and third scan signals S1, S2, and S3 are not particularly limited as long as the turn-on period t1 is longer than the turn-on periods t2 and t3. In one exemplary embodiment, the lengths of the turn-on periods t1, t2, and t3 may be set such that differences in luminance between display units disposed along each scan line can be reduced or minimized by compensating for differences in slew rate caused by the different lengths of the first, second, and third scan lines SL1, SL2, and SL3.

Accordingly, for the 1b-th pixel unit PX1b, which is provided with the first scan signal S1, the first scan signal S1 may have a sufficiently long turn-on period, and as a result, a sufficient amount of time to charge the storage capacitor (Cst of FIG. 5) of the 1b-th pixel unit PX1b, which is provided with the first scan signal S1, with a voltage corresponding to the data signal provided via the data line connected to the 1b-th pixel unit PX1b can be secured. In this manner, differences in luminance between pixel units can be reduced or minimized, display quality can be improved (e.g., increased), and a vertical stripe defect that may occur in the display area 110 due to differences in luminance can be addressed.

If the first, second, and third emission control signals EM1, EM2, and EM3 are not turned off sufficiently for more than a set or predetermined amount of time, the compensation of the threshold voltage Vth of the first transistor (T1 of FIG. 5) of the 1b-th pixel unit PX1b, as described above with reference to FIG. 7, may not be performed properly. A turn-off period is defined as a period of time during which a turn-off voltage for turning off a transistor that receives an emission control signal is provided.

Figure 11B:
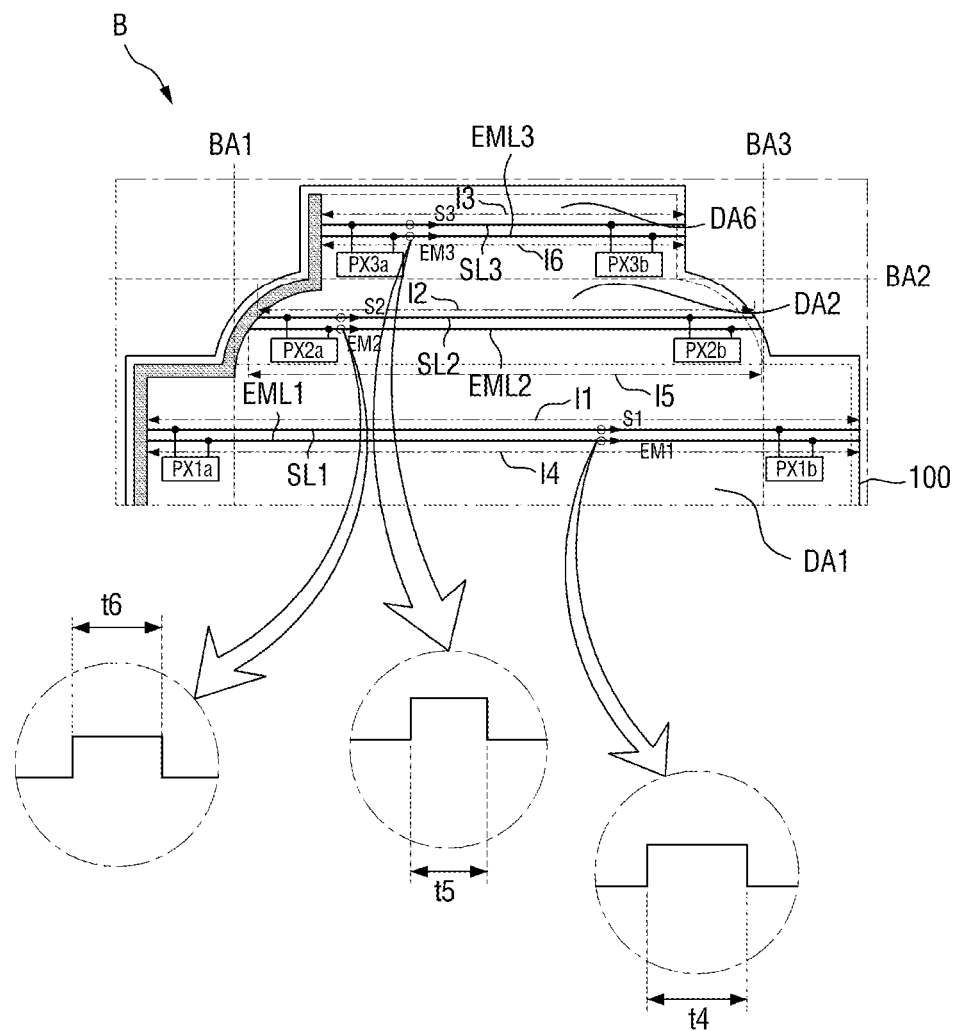

Referring to FIG. 11B, the signal wiring unit 150 may control the length of the turn-off period of an emission control signal provided to an emission control line in consideration of the length of the emission control line. For example, the signal wiring unit 150 may control the turn-off period of an emission control signal provided to a relatively long emission control line to be longer than the turn-off period of an emission control signal provided to a relatively short emission control line.

For example, a turn-off period t4 of the first emission control signal EM1 provided to the first emission control line EML1 is longer than a turn-off period t5 of the second emission control signal EM2 provided to the second emission control line EML2 and a turn-off period t6 of the third emission control signal EM3 provided to the third emission control line EML3. The turn-off period t5 of the second emission control signal EM2 may be longer than the turn-off period t6 of the third emission control signal EM3.

Accordingly, for the 1b-th pixel unit PX1b, which is provided with the first emission control signal EM1, the first emission control signal EM1 may have a sufficiently long turn-off period, and as a result, a sufficient amount of time to compensate for the threshold voltage Vth of the first transistor (T1 of FIG. 5) of the 1b-th pixel unit PX1b can be secured.

Figure 12A:
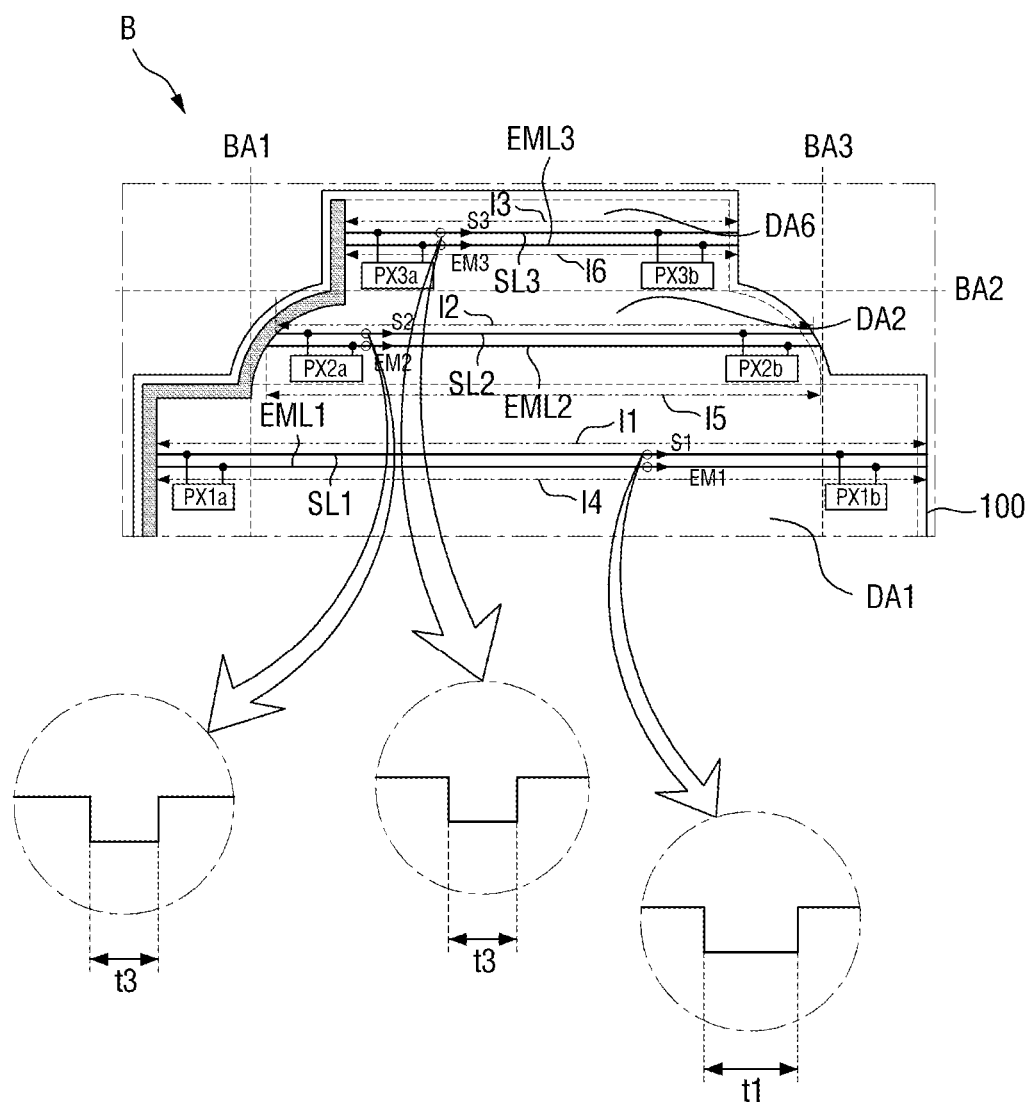

Referring to FIG. 12A, unlike what is shown in FIG. 11A, the turn-on period t2 of the second scan signal S2 may be the same as the turn-on period t3 of the third scan signal S3.

That is, because the difference between the length l2 of the second scan line SL2 and the length l3 of the third scan line SL3 is smaller than the difference between the length l3 of the third scan line SL3 and the length l1 of the first scan line SL1, the turn-on period t2 of the second scan signal S2 may be set to be the same as the turn-on period t3 of the third scan signal S3, as illustrated in FIG. 11A.

Figure 12B:
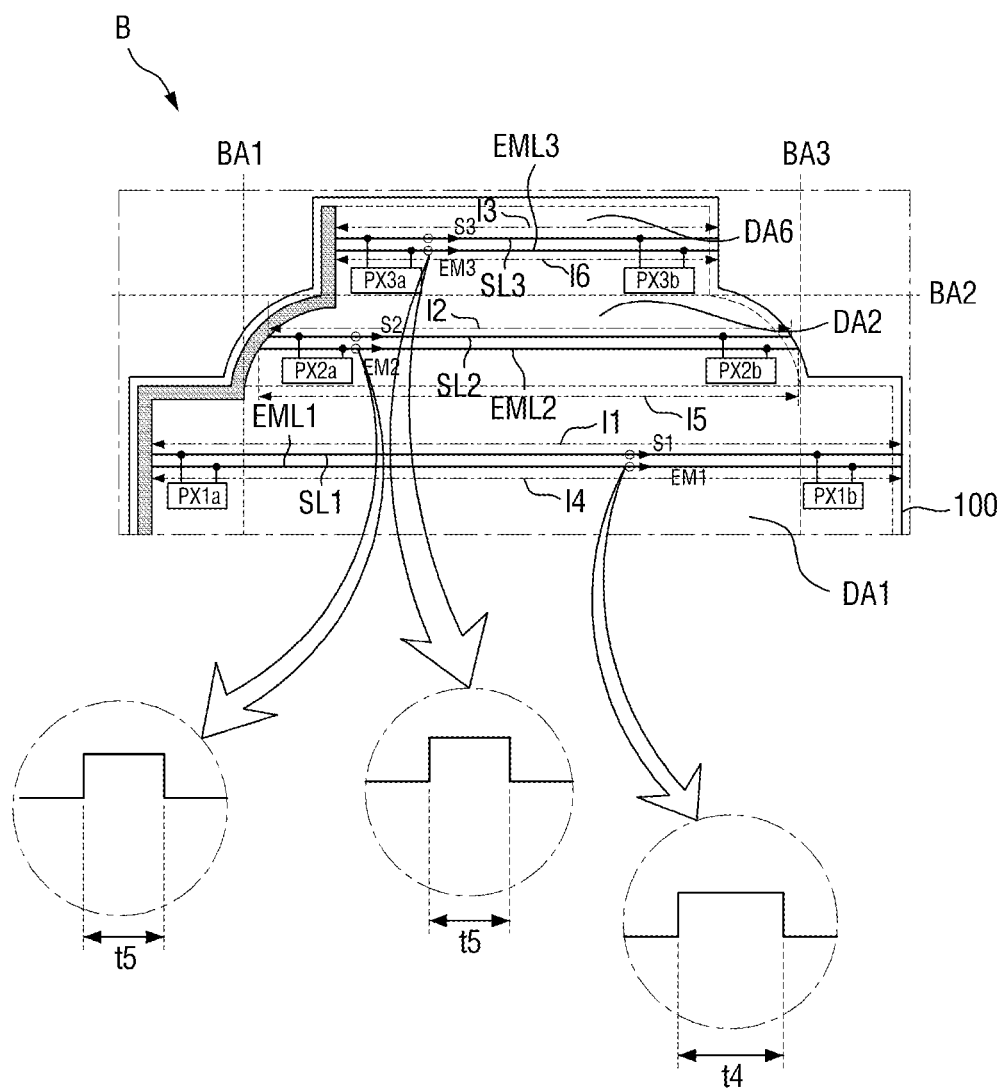

Referring to FIG. 12B, unlike what is shown in FIG. 12A, the turn-off period t5 of the second emission control signal EM2 may be the same as the turn-off period t6 of the third emission control signal EM3.

However, the lengths of the turn-on periods t1, t2, and t3 of the first, second, and third scan signals S1, S2, and S3 and the lengths of the turn-off periods t4, t5, and t6 of the first, second, and third emission control signals EM1, EM2, and EM3 are not particularly limited, and may be controlled in consideration of the lengths of the first, second, and third scan lines SL1, SL2, and SL3 and the lengths of the first, second, and third emission control signals EML1, EML2, and EML3.

Another exemplary method of compensating for differences in slew rate will hereinafter be described with reference to FIGS. 13 and 14.

Figure 13:
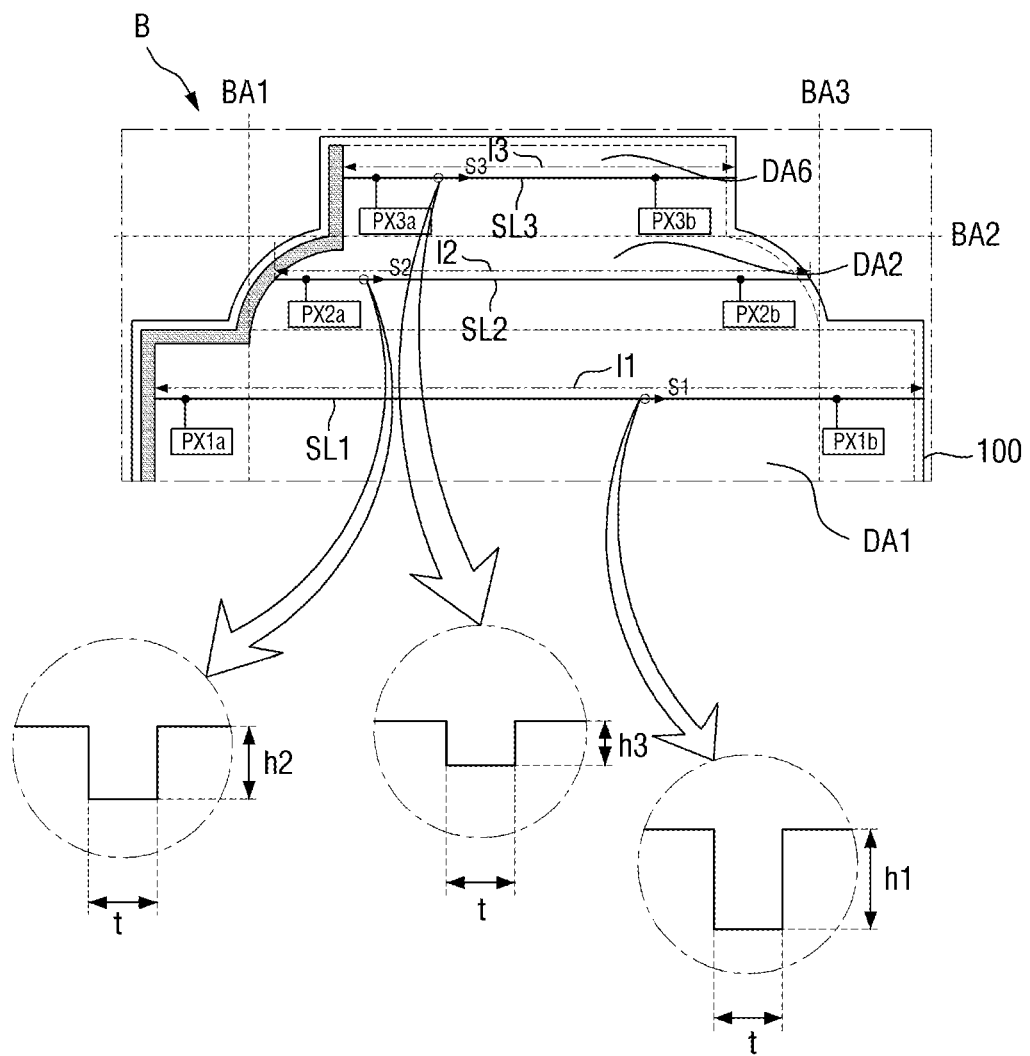

First, second, and third scan signals S1, S2, and S3 of FIG. 13, unlike the first, second, and third scan signals S1, S2, and S3 of FIG. 12, have the same turn-on period, that is, a turn-on period t, and have different pulse amplitudes.

The signal wiring unit 150 may control the pulse amplitude of a scan signal provided to a scan line in consideration of the length of the scan line. The term "pulse amplitude", as used herein, denotes the difference between the minimum voltage and the maximum voltage of a scan signal. For example, the signal wiring unit 150 may control the pulse amplitude of a scan signal provided to a relatively long scan line to be greater than the pulse amplitude of a scan signal provided to a relatively short scan line.

For example, a pulse amplitude h1 of the first scan signal S1 provided to the first scan line SL1 is greater than a pulse amplitude h2 of the second scan signal S2 provided to the second scan line 5L2 and a pulse amplitude h3 of the third scan signal S3 provided to the third scan line SL3. The pulse amplitude h2 of the second scan signal S2 may be greater than the pulse amplitude h3 of the third scan signal S3.

The pulse amplitudes h1, h2, and h3 of the first, second, and third scan signals S1, S2, and S3 are not particularly limited as long as the pulse amplitude h1 is longer than the pulse amplitudes h2 and h3. In one exemplary embodiment, the pulse amplitudes h1, h2, and h3 may be set such that differences in luminance between display units disposed along each scan line can be reduced or minimized by compensating for differences in slew rate caused by the different lengths of the first, second, and third scan lines SL1, SL2, and SL3.

In this manner, differences in luminance between pixel units can be reduced or minimized, display quality can be improved (e.g., increased), and a vertical stripe defect that may occur in the display area 110 due to differences in luminance can be addressed.

Figure 14:
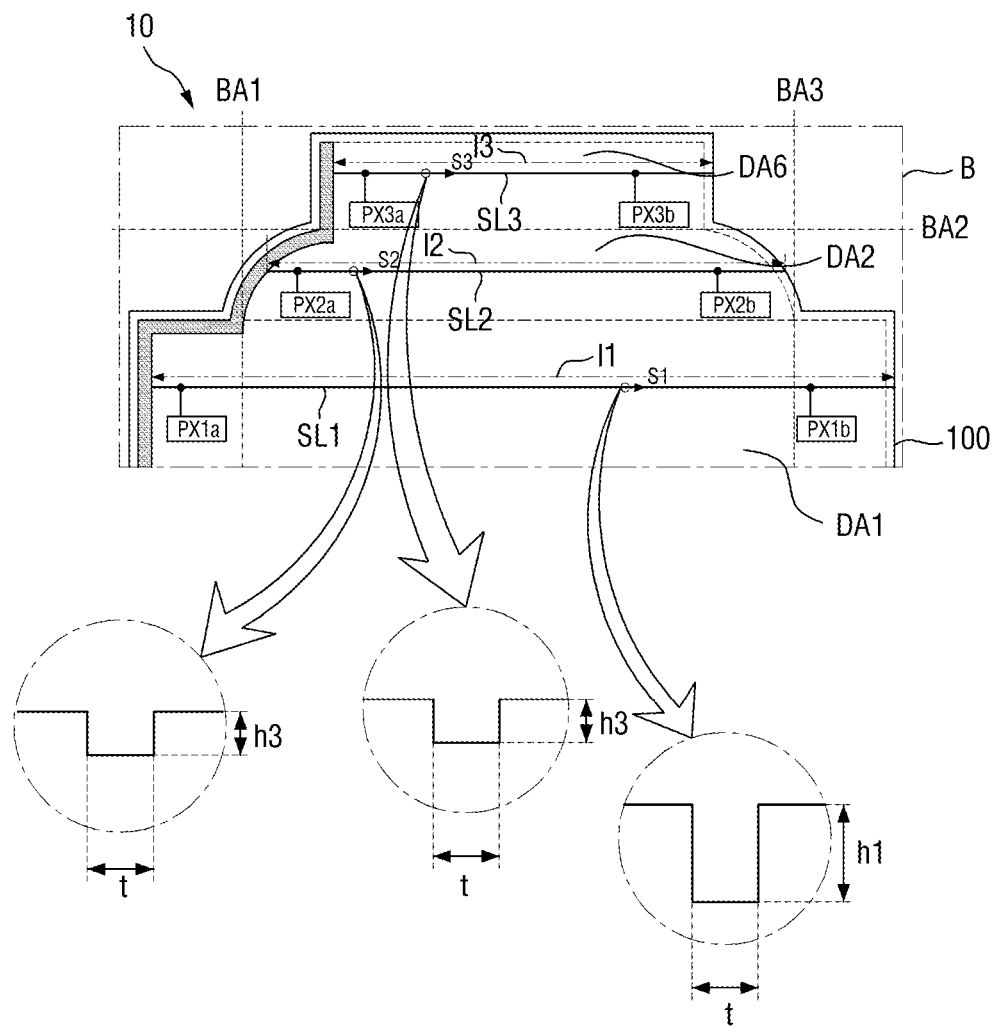

Referring to FIG. 14, unlike what is shown in FIG. 13, the pulse amplitude h2 of the second scan signal S2 may be the same as the pulse amplitude h3 of the third scan signal S3.

That is, because the difference between the length l2 of the second scan line SL2 and the length l3 of the third scan line SL3 is smaller than the difference between the length l3 of the third scan line SL3 and the length l1 of the first scan line SL1, the pulse amplitude h2 of the second scan signal S2 may be set to be the same as the pulse amplitude h3 of the third scan signal S3, as illustrated in FIG. 14.

In short, the organic light-emitting display device 10 can compensate for differences in slew rate by controlling both the turn-on period and the pulse amplitude of each scan signal.

The characteristics of data signals of the organic light-emitting display device 10 and how to compensate for the characteristics of the data signals will hereinafter be described.

Figure 15:
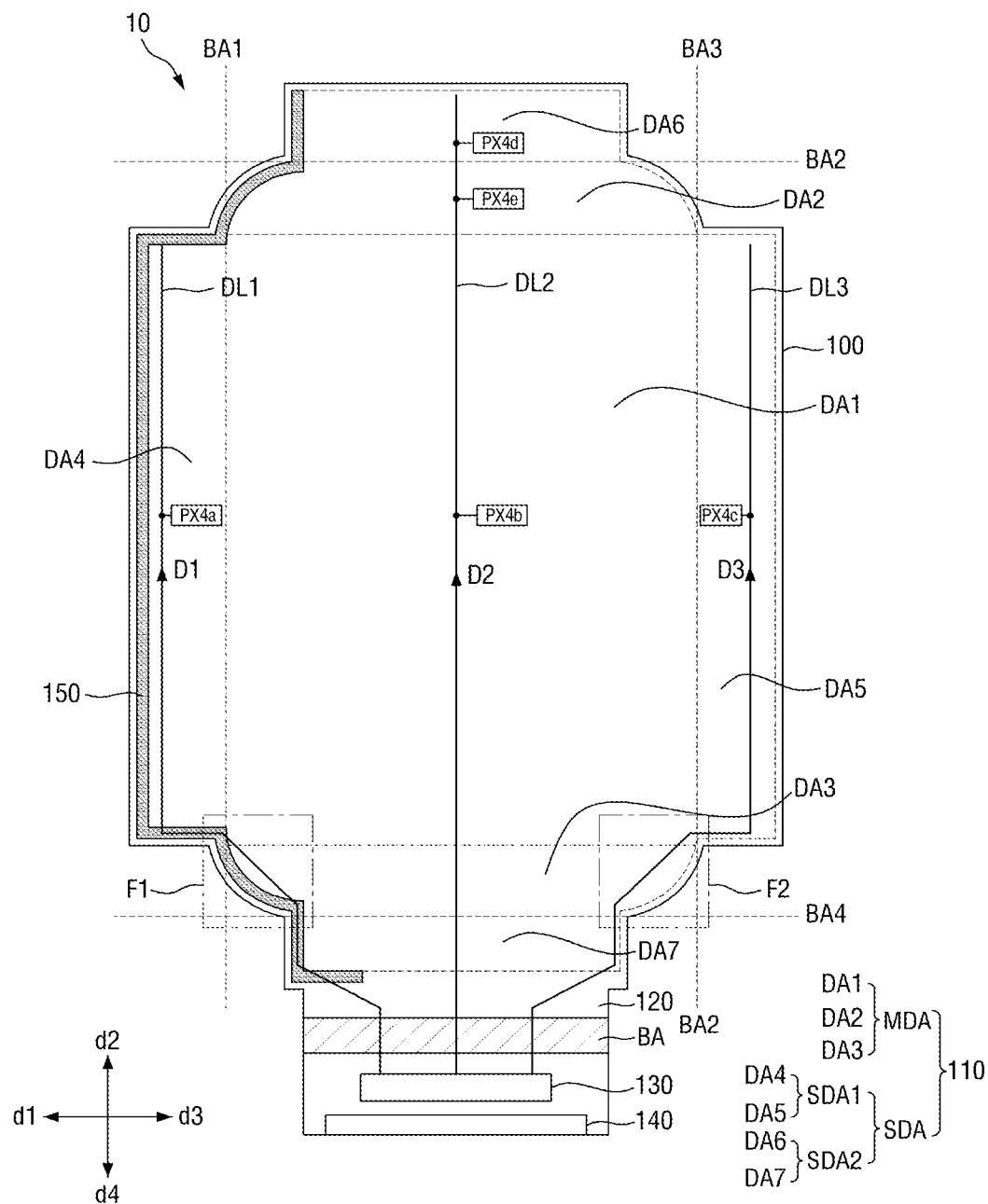
FIG. 15 is a plan view for illustrating the characteristics of data signals of the organic light-emitting display device according to an exemplary embodiment of the present disclosure.

FIG. 15 is a plan view for illustrating the characteristics of data signals of the organic light-emitting display device according to an exemplary embodiment of the present disclosure. The characteristics of driving signals of the organic light-emitting display device according to an exemplary embodiment of the present disclosure will hereinafter be described, taking, for example, first, second, and third data lines DL1, DL2, and DL3 and 4a-th, 4b-th, 4c-th, 4d-th, and 4e-th pixel units PX4a, PX4b, PX4c, PC4d, and PX4e connected to the first, second, and third data lines DL1, DL2, and DL3. Here, the terms "first", "second", and "third" are used to describe data lines and should not be construed as limiting, for example, the arrangement of the data lines.

The 4a-th pixel unit PX4a is connected to the first data line DL1 and is disposed in the fourth display area DA4. The 4b-th pixel unit PX4b is connected to the second data line DL2 and is disposed in the first display area DA1. The 4c-th pixel unit PX4c is connected to the third data line DL3 and is disposed in the fifth display area DA5. The 4d-th and 4e-th pixel unit PX4d and PX4e are disposed in the second and sixth display areas DA2 and DA6, respectively, and are both connected to the second data line DL2. The 4a-th, 4b-th, and 4c-th pixel units PX4a, PX4b, and PX4c are arranged in the same row and are thus all connected to the same scan line.

As described above, the fourth and fifth display areas DA4 and DA5 are bent toward the rear of the first display area DA1 along the first and second bending lines BA1 and BA2, respectively. Accordingly, the first data line DL1, which is for providing a first data signal D1 to the 4a-th pixel unit PX4a disposed in the fourth display area DA4, may have bent portions in a first area F1. Also, the third data line DL3, which is for providing a third data signal D3 to the 4c-th pixel unit PX4c disposed in the fifth display area DA5, may have bent portions in a second area F2. On the other hand, the second data line DL2, which is for providing a second data signal D2 to the 4b-th pixel unit PX4b, may not have bent portions.

Accordingly, the first, second, and third data lines DL1, DL2, and DL3, to which the 4a-th, 4b-th, and 4c-th pixel units PX4a, PX4b, and PX4c are respectively connected, may have different lengths. For example, the lengths of the first, second, and third data lines DL1, DL2, and DL3 between the driver IC 130 to the 4a-th, 4b-th, and 4c-th pixel units PX4a, PX4b, and PX4c, respectively, may differ from one another.

Because the first, second, and third data lines DL1, DL2, and DL3 have different lengths, differences in luminance between pixel units and a vertical stripe defect may occur because of different voltage drops caused by the different resistances of the first, second, and third data lines DL1, DL2, and DL3.

Also, because there are differences in distance from the driver IC 130 even between the 4b-th, 4d-th, and 4e-th pixel units PX4b, PX4d, and PX4e all connected to the same data line, that is, the second data line DL2, differences in luminance may be generated between the first through seventh display areas DA1 through DA7. That is, even though the same data signal is provided to all the first through seventh display areas DA1 through DA7, the luminance of the first display area DA1 may be higher than the luminance of the other display areas.

Accordingly, the organic light-emitting display device 10 may provide a compensated data signal to each pixel unit in consideration of the location of a display area where the corresponding pixel resides.

This will hereinafter be described, taking, for example, the second data line DL2.

Because the luminance of the 4d-th pixel unit PX4d disposed in the sixth display area DA6 is lower than the luminance of the 4d-th and 4e-th pixel units PX4d and PX4e, a data signal to be provided to the 4d-th and 4e-th pixel units PX4d and PX4e may be compensated for.

For example, the second data signal D2 may be provided "as is" to the 4d-th pixel unit PX4d, and a compensated data signal obtained by lowering the gray level of the second data signal D2 may be provided to the 4e-th pixel unit PX4e. Also, another compensated data signal obtained by lowering the gray level of the second data signal D2 may be provided to the 4b-th pixel unit PX4b. The gray level of the compensated data signal provided to the 4b-th pixel unit PX4b may be lower than the gray level of the compensated data signal provided to the 4e-th pixel unit PX4e.

The degree to which the gray level of the second data signal D2 is lowered to produce a compensated data signal may be determined based on the distance from the driver IC 130. For example, the degree to which the gray level of the second data signal D2 is lowered to produce a compensated data signal may be greatest for a pixel unit closest to the driver IC 130.

That is, the uniformity of luminance between the first through seventh display areas DA1 through DA7 can be improved (e.g., increased) by controlling the gray level of a data signal provided to each pixel unit in each of the first through seventh display areas DA1 through DA7 in consideration of the distance between the corresponding pixel unit and the driver IC 130.

Organic light-emitting display device according to other exemplary embodiments of the present disclosure will hereinafter be described with reference to FIGS. 16 through 19, avoiding any repetitive description of the exemplary embodiment of FIGS. 1 through 15.

FIGS. 16 through 19 are plan views of organic light-emitting display devices according to other exemplary embodiments of the present disclosure.

Figure 16:
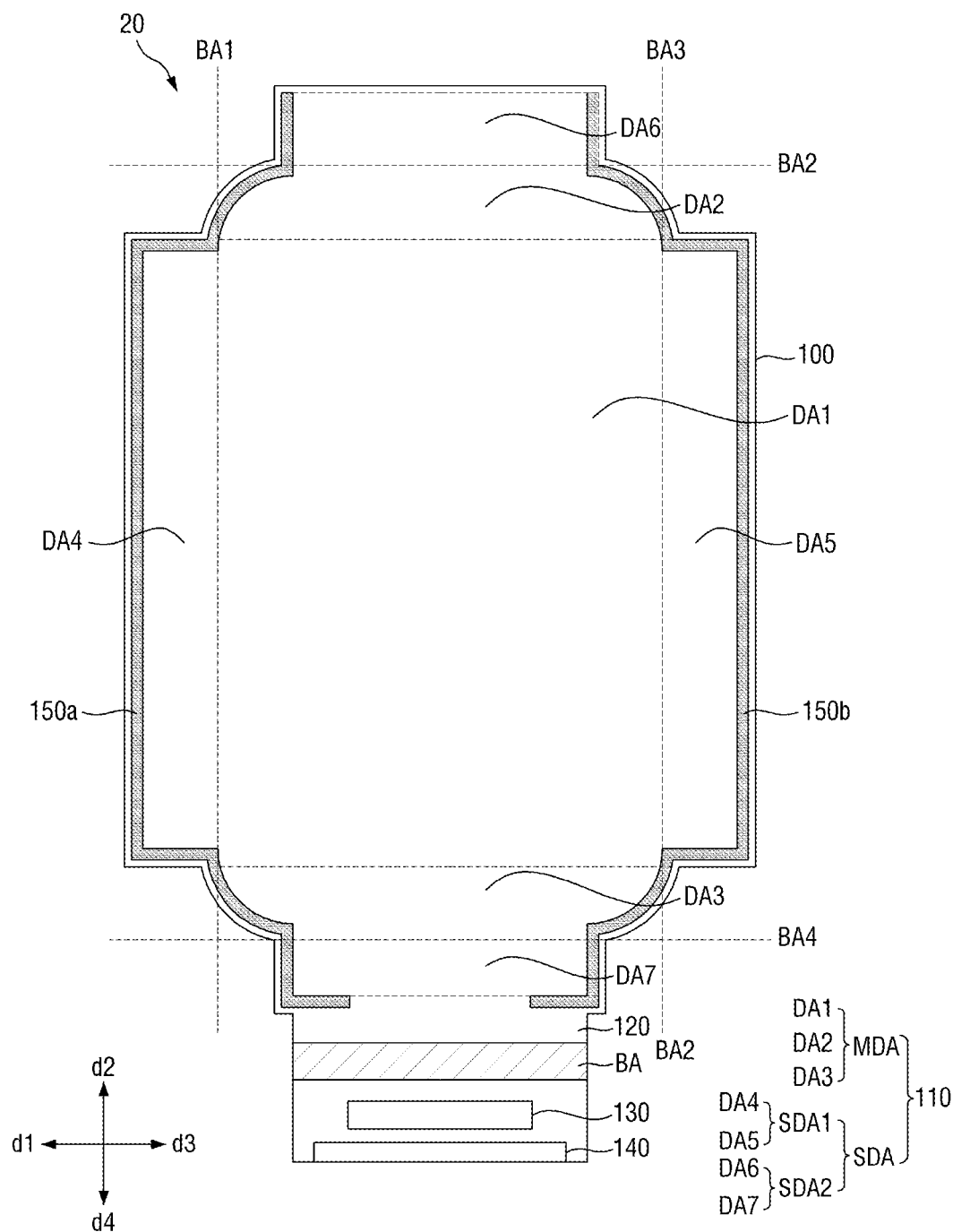
FIGS. 16-19 are plan views of organic light-emitting display devices according to other exemplary embodiments of the present disclosure.

Referring to FIG. 16, an organic light-emitting display device 20 differs from the organic light-emitting display device 10 of FIG. 1 in that it includes first and second signal wiring units 150a and 150b. That is, the organic light-emitting display device 20 includes the first signal wiring unit 150a, which corresponds to the signal wiring unit 150 of the organic light-emitting display device 10 of FIG. 1, and the second signal wiring unit 150b, which is opposite to the first signal wiring unit 150a with respect to a central display area MDA.

The second signal wiring unit 150b may be disposed to extend along the sides of seventh, third, fourth, second, and sixth display areas DA7, DA3, DA4, DA2, and DA6.

The first and second signal wiring units 150a and 150b may generate a plurality of driving signals and may provide the plurality of driving signals to a plurality of pixel units PX, which are arranged in the first through seventh display areas DA1 through DA7.

In one exemplary embodiment, the first and second signal wiring units 150a and 150b may generate the same set of signals and may provide them to the pixel units PX. For example, when the first and second signal wiring units 150a and 150b both provide a first scan signal S1 to a first scan line SL1, a voltage drop that may be caused by the resistance of the first scan line SL1 to which the first scan signal S1 is provided can be prevented or reduced. In this case, the first scan signal S1 provided to the first scan line SL1 may be set to have a relatively long turn-on period and/or a relatively large pulse amplitude in order to compensate for differences in slew rate that are caused due to the first scan line SL1 having a different length from second and third scan lines SL2 and SL3.

In another exemplary embodiment, the first and second signal wiring units 150a and 150b may generate different sets of signals and may provide them to the pixel units PX. For example, the first signal wiring unit 150a may be a scan driver generating a plurality of scan signals and providing the plurality of scan signals to the pixel units PX, and the second signal wiring unit 150b may be an emission driver generating a plurality of emission control signals and providing the plurality of emission control signals to the pixel units PX.

Figure 17:
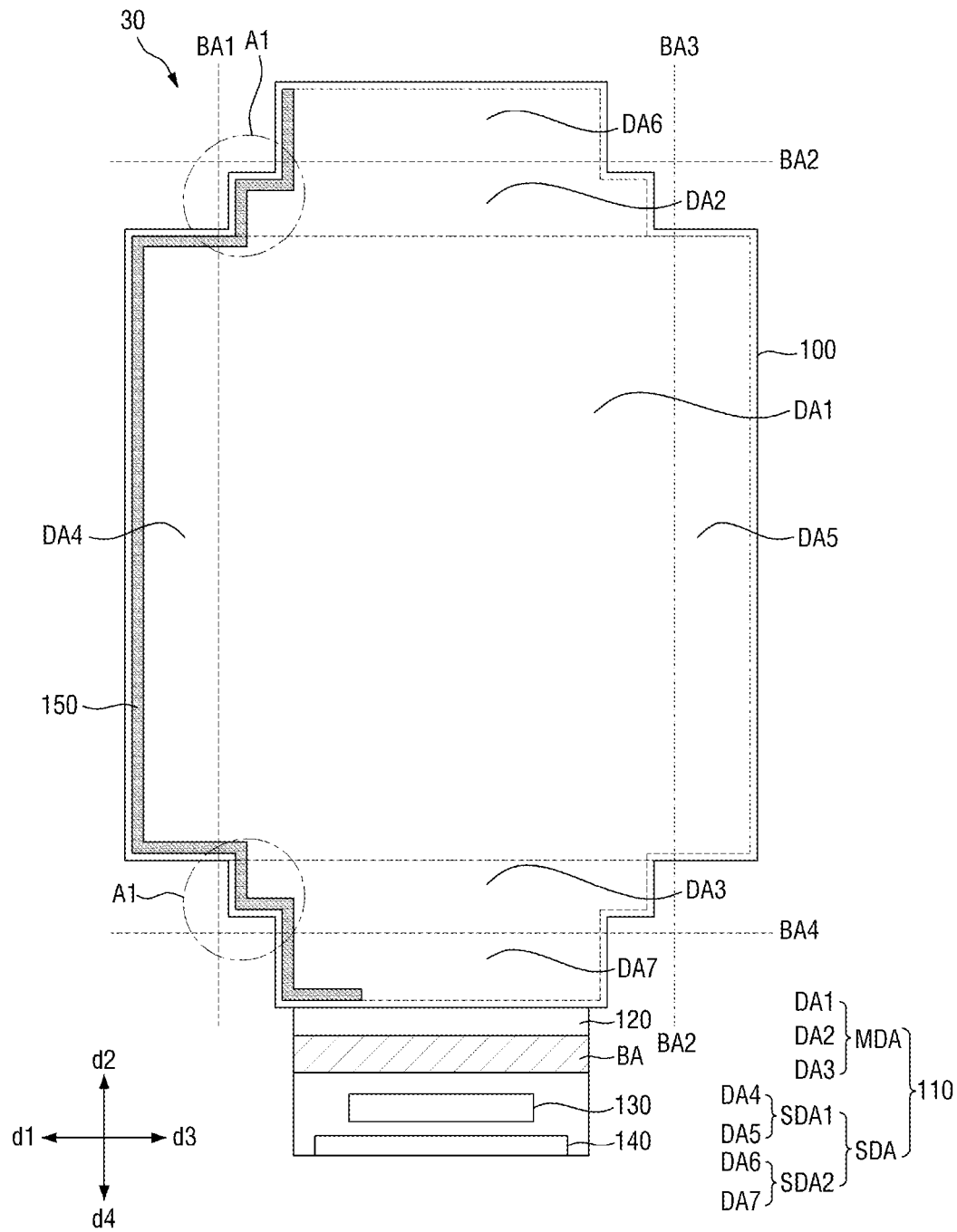

Referring to FIG. 17, corner areas A1 of second and third display areas DA2 and DA3 are at right angles. That is, an organic light-emitting display device 30 of FIG. 17 differs from the organic light-emitting display device 10 of FIG. 1 having rounded corner areas A are rounded.

A signal wiring unit 150 may extend along the sides of seventh, third, fourth, second, and sixth display areas DA7, DA3, DA4, DA2, and DA6, almost conforming to the outlines of the seventh, third, fourth, second, and sixth display areas DA7, DA3, DA4, DA2, and DA6.

Figure 18:
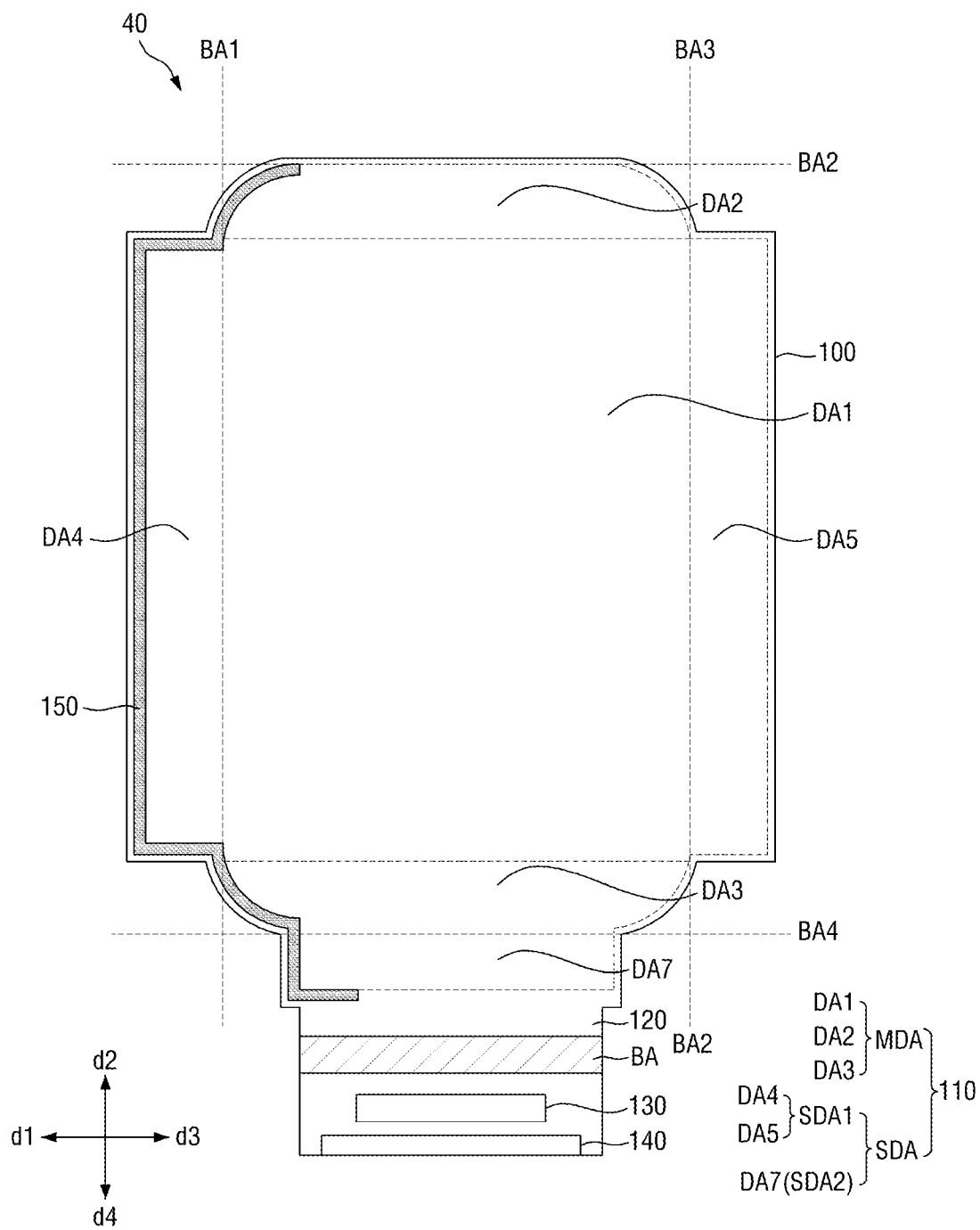

Referring to FIG. 18, an organic light-emitting display device 40 differs from the organic light-emitting display device 10 of FIG. 1 in that it does not include a sixth display area DA6.

Figure 19:
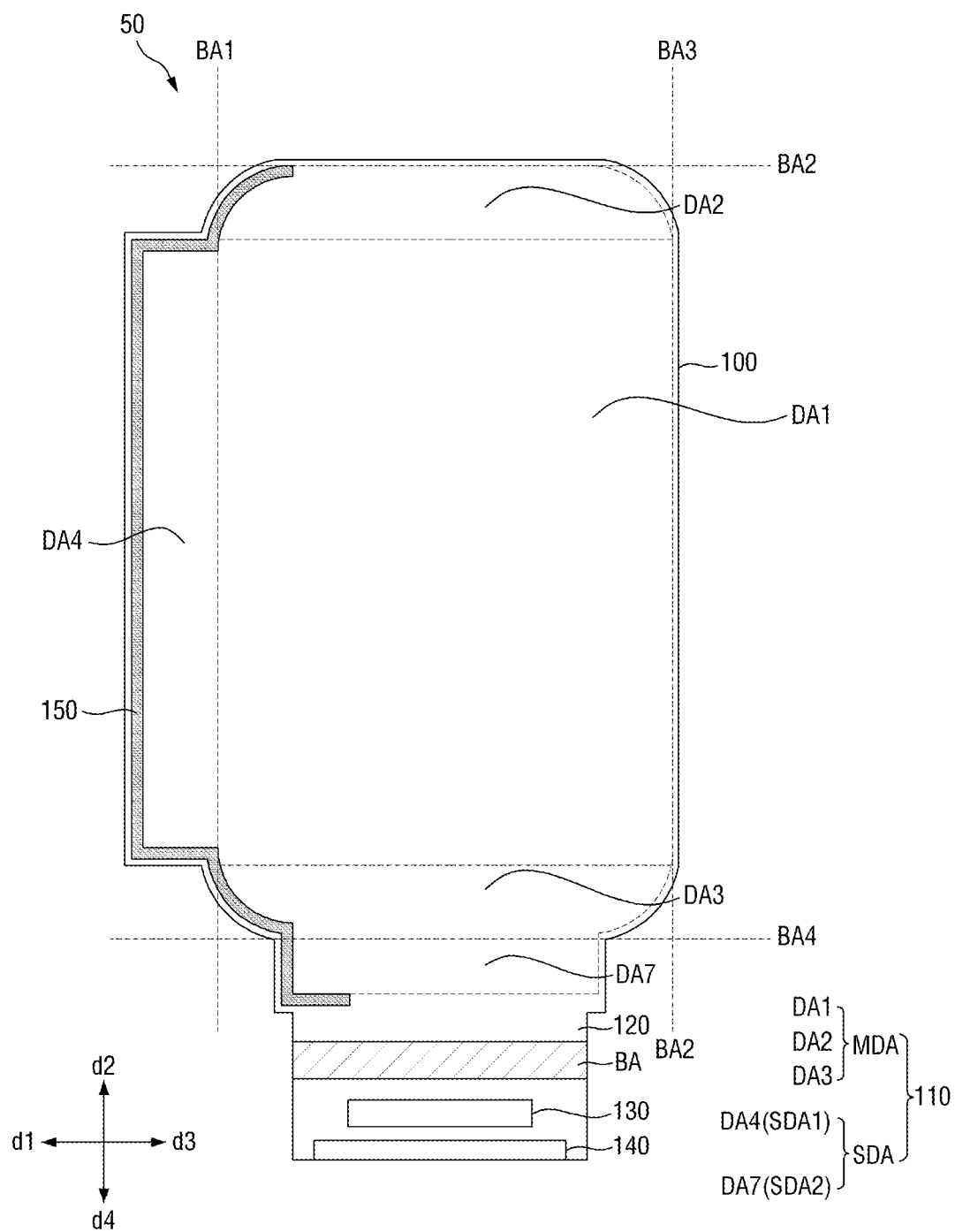

Referring to FIG. 19, an organic light-emitting display device 50 differs from the organic light-emitting display device 40 of FIG. 18 in that it does not include a fifth display area DA5.

That is, even when not all the first through seventh display areas DA1 through DA7 of FIG. 1 are provided, differences in luminance between a plurality of pixel units PX can be reduced or minimized by controlling the turn-on period and/or the pulse amplitude of signals provided to each signal line and/or compensating for each data when the luminance differences are caused due to differences in length between a plurality of scan lines, a plurality of data lines, or a plurality of emission control lines that all extend in the same direction.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "below", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use," "using," and "used" may be considered synonymous with the terms "utilize," "utilizing," and "utilized," respectively.

The display device and/or any other relevant devices or components, such as the driver IC, according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in connection with what is presently considered to be practical exemplary embodiments, it is to be understood that the invention is not limited to the disclosed embodiments, and is intended to cover various suitable modifications and equivalent arrangements included within the spirit and scope of the invention as defined by the appended claims and equivalents thereof.

What is claimed is:

1. An organic light-emitting display device comprising:
    a substrate on which a display area is provided, the display area comprising:
        a central display area comprising a first pixel unit;
        a first edge display area extending from the central display area along a first direction; and
        a second edge display area comprising a second pixel unit and extending from the central display area along a second direction that intersects the first direction; and
    a first signal wiring unit overlapping with the first and second edge display areas, the first signal wiring unit being configured to provide a first scan signal having a first turn-on period to the first pixel unit and to provide a second scan signal having a second turn-on period to the second pixel unit,
    wherein the first edge display area is bent along a first bending line, which extends along the first direction,
    wherein the second edge display area is bent along a second bending line, which extends along the second direction, and
    wherein the first turn-on period is longer than the second turn-on period.

2. The organic light-emitting display device of claim 1, wherein a pulse amplitude of the first scan signal is greater than a pulse amplitude of the second scan signal.

3. The organic light-emitting display device of claim 1, wherein the central display area comprises a first central display area comprising the first pixel unit, and a second central display area, which is between the first central display area and the second edge display area and comprises a third pixel unit.

4. The organic light-emitting display device of claim 3, wherein the first signal wiring unit is configured to provide a third scan signal having a third turn-on period to the third pixel unit, and
    wherein the third turn-on period is shorter than the first turn-on period.

5. The organic light-emitting display device of claim 3, wherein corner areas of the second central display area are rounded.

6. The organic light-emitting display device of claim 1, wherein the first signal wiring unit is configured to provide a first emission control signal having a first turn-off period to the first pixel unit and is configured to provide a second emission control signal having a second turn-off period to the second pixel unit, and
    wherein the first turn-off period is longer than the second turn-off period.

7. The organic light-emitting display device of claim 1, wherein the display area further comprises a third edge display area, which extends from the central display area along a third direction that is opposite to the first direction, and a fourth edge display area, which comprises a fourth pixel unit and extends from the central display area along a fourth direction that is opposite to the second direction,
    wherein the third edge display area is bent along a third bending line, which extends along the second direction, and
    wherein the fourth edge display area is bent along a fourth bending line, which extends along the first direction.

8. The organic light-emitting display device of claim 7, wherein the first signal wiring unit is configured to provide a fourth scan signal having a fourth turn-on period to the fourth pixel unit, and
    wherein the first turn-on period is longer than the fourth turn-on period.

9. The organic light-emitting display device of claim 7, further comprising:
    a second signal wiring unit overlapping with the second, third, and fourth edge display areas.

10. The organic light-emitting display device of claim 1, wherein the first signal wiring unit is connected to the first pixel unit via a first scan line, which is configured to provide the first scan signal, and is connected to the second pixel unit via a second scan line, which is configured to provide the second scan signal, and
    wherein the first scan line is longer than the second scan line.

11. An organic light-emitting display device comprising:
    a substrate on which a display area is provided, the display area comprising:
        a central display area comprising a first pixel unit;
        a first edge display area extending from the central display area along a first direction; and
        a second edge display area comprising a second pixel unit and extending from the central display area along a second direction that intersects the first direction; and
    a signal wiring unit overlapping with the first and second edge display areas, the signal wiring unit being configured to provide a first scan signal having a first pulse amplitude to the first pixel unit and to provide a second scan signal having a second pulse amplitude to the second pixel unit,
    wherein the first edge display area is bent along a first bending line, which extends along the first direction,
    wherein the second edge display area is bent along a second bending line, which extends along the second direction, and
    wherein the first pulse amplitude is greater than the second pulse amplitude.

12. The organic light-emitting display device of claim 11, wherein the first scan signal has a first turn-on period, wherein the second scan signal has a second turn-on period, and wherein the first turn-on period is longer than the second turn-on period.

13. The organic light-emitting display device of claim 11, wherein the signal wiring unit is connected to the first pixel unit via a first scan line, which provides the first scan signal, and is connected to the second pixel unit via a second scan line, which provides the second scan signal, and wherein the first scan line is longer than the second scan line.

14. The organic light-emitting display device of claim 11, wherein the central display area comprises a first central display area comprising the first pixel unit, and a second central display area, which is between the first central display area and the second edge display area and comprises a third pixel unit.

15. The organic light-emitting display device of claim 14, wherein the signal wiring unit is configured to provide a third scan signal having a third pulse amplitude to the third pixel unit, and wherein the third pulse amplitude is smaller than the first pulse amplitude.

16. An organic light-emitting display device comprising:
a substrate on which a display area is provided, the display area comprising:
a central display area comprising a first pixel unit;
a first edge display area extending from the central display area along a first direction; and
a second edge display area comprising a second pixel unit and extending from the central display area along a second direction that intersects the first direction; and
a signal wiring unit overlapping with the first and second edge display areas, the signal wiring unit being connected to the first pixel unit via a first scan line and being connected to the second pixel unit via a second scan line, wherein the signal wiring unit is configured to provide a first scan signal having a first turn-on period to the first pixel unit via the first scan line and to provide a second scan signal having a second turn-on period to the second pixel unit, wherein the first scan line is longer than the second scan line, and wherein the first turn-on period is longer than the second turn-on period.

17. The organic light-emitting display device of claim 16, wherein a pulse amplitude of the first scan signal is greater than a pulse amplitude of the second scan signal.

18. The organic light-emitting display device of claim 16, wherein the central display area comprises a first central display area, in which the first pixel unit is disposed, and a second central display area, which is disposed between the first central display area and the second edge display area and comprises a third pixel unit.

19. The organic light-emitting display device of claim 18, wherein the signal wiring unit is configured to provide a third scan signal having a third turn-on period to the third pixel unit via a third scan line, wherein the first scan line is longer than the third scan line, and wherein the third turn-on period is shorter than the first turn-on period.

20. The organic light-emitting display device of claim 16, wherein the signal wiring unit is configured to provide a first emission control signal having a first turn-off period to the first pixel unit and to provide a second emission control signal having a second turn-off period to the second pixel unit, and wherein the first turn-off period is longer than the second turn-off period.

* * * * *